(12) United States Patent
Asnaashari et al.

(10) Patent No.: US 11,270,769 B2
(45) Date of Patent: Mar. 8, 2022

(54) NETWORK ROUTER DEVICE WITH HARDWARE-IMPLEMENTED LOOKUPS INCLUDING TWO-TERMINAL NON-VOLATILE MEMORY

(71) Applicant: Crossbar, Inc., Santa Clara, CA (US)

(72) Inventors: Mehdi Asnaashari, Danville, CA (US); Hagop Nazarian, San Jose, CA (US)

(73) Assignee: CROSSBAR, INC., Santa Clara, CA (US)

( * ) Notice: Subject to any disclaimer, the term of this patent is extended or adjusted under 35 U.S.C. 154(b) by 0 days.

(21) Appl. No.: 16/398,943

(22) Filed: Apr. 30, 2019

(65) Prior Publication Data
US 2019/0259452 A1 Aug. 22, 2019

Related U.S. Application Data

(63) Continuation-in-part of application No. 15/591,925, filed on May 10, 2017, now Pat. No. 10,388,374, (Continued)

(51) Int. Cl.
| | |
|---|---|
| *G11C 13/00* | (2006.01) |
| *G11C 11/16* | (2006.01) |
| *G11C 15/02* | (2006.01) |
| *G06F 12/02* | (2006.01) |
| *G11C 7/10* | (2006.01) |

(Continued)

(52) U.S. Cl.
CPC ...... *G11C 13/0069* (2013.01); *G06F 12/0223* (2013.01); *G11C 7/1006* (2013.01); *G11C 11/1675* (2013.01); *G11C 13/0002* (2013.01); *G11C 15/02* (2013.01); *G11C 15/046* (2013.01); *H03K 19/18* (2013.01)

(58) Field of Classification Search
None
See application file for complete search history.

(56) References Cited

U.S. PATENT DOCUMENTS

| | | |
|---|---|---|
| 7,095,642 B1 | 8/2006 | Parent et al. |
| 9,306,851 B1 * | 4/2016 | Gazit ............... G06F 16/90339 |

(Continued)

FOREIGN PATENT DOCUMENTS

WO  2017131792  8/2017

OTHER PUBLICATIONS

Examination Report for corresponding Taiwanese Patent Application No. 107134397 dated Oct. 7, 2019, 18 pages long.

(Continued)

*Primary Examiner* — Saad Khawar
(74) *Attorney, Agent, or Firm* — Wegman Hessler

(57) ABSTRACT

A non-volatile programmable circuit configurable to perform logic functions, is provided. The programmable circuit can employ two-terminal non-volatile memory devices to store information, thereby mitigating or avoiding disturbance of programmed data in the absence of external power. Two-terminal resistive switching memory devices having high current on/off ratios and fast switching times can also be employed for high performance, and facilitating a high density array. For look-up table applications, input/output response times can be several nanoseconds or less, facilitating much faster response times than a memory array access for retrieving stored data.

23 Claims, 17 Drawing Sheets

Related U.S. Application Data which is a continuation of application No. 14/992,718, filed on Jan. 11, 2016, now Pat. No. 9,659,646.

(51) Int. Cl.
  *H03K 19/18* (2006.01)
  *G11C 15/04* (2006.01)

(56) References Cited

U.S. PATENT DOCUMENTS

| | | |
|---|---|---|
| 9,524,210 B1 | 12/2016 | Asnaashari |
| 2003/0179623 A1* | 9/2003 | Inoue .................. G11C 15/043 365/200 |
| 2012/2003039 | 2/2012 | Zhu et al. |
| 2013/0054886 A1* | 2/2013 | Eshraghian ........ G11C 13/0007 711/108 |
| 2013/0132685 A1 | 5/2013 | Vogelsang et al. |
| 2014/0133211 A1 | 5/2014 | Nazarian et al. |
| 2014/0293674 A1 | 10/2014 | Johnson |
| 2015/0003156 A1 | 1/2015 | Berckmann et al. |
| 2015/0009745 A1 | 1/2015 | Nguyen et al. |
| 2016/0189775 A1 | 6/2016 | Buchanan |
| 2016/0260775 A1 | 9/2016 | Takaki |
| 2017/0032839 A1 | 2/2017 | Bertin et al. |

OTHER PUBLICATIONS

Notice of Allowance for corresponding U.S. Appl. No. 16/368,156 dated Mar. 26, 2020 9 pages long.

Notice of Allowance for corresponding U.S. Appl. No. 16/144,771 dated Feb. 20, 2020 8 pages long.

Notification of International Preliminary Report on Patentability for corresponding International Patent Application No. PCT/US2018/053544 dated Jan. 17, 2020, 18 pages long.

International Search Report and Written Opinion for corresponding International Patent Application No. PCT/US2018/053544 dated Dec. 4, 2018, 12 pages long.

Notice of Allowance for corresponding Taiwan Patent Application No. 107134397 dated May 13, 2020, 4 pages long.

* cited by examiner

NETWORK ROUTER DEVICE WITH HARDWARE-IMPLEMENTED LOOKUPS INCLUDING TWO-TERMINAL NON-VOLATILE MEMORY

CROSS-REFERENCE TO RELATED APPLICATIONS

The present application for patent is a continuation-in-part of U.S. patent application Ser. No. 15/591,925 filed May 10, 2017 and titled: PROGRAMMABLE LOGIC APPLICATIONS FOR AN ARRAY OF HIGH ON/OFF RATIO AND HIGH SPEED NON-VOLATILE MEMORY CELL, which is a continuation of U.S. application Ser. No. 14/992,718 (now U.S. Pat. No. 9,659,646) filed Jan. 11, 2016 and titled: PROGRAMMABLE LOGIC APPLICATIONS FOR AN ARRAY OF HIGH ON/OFF RATIO AND HIGH SPEED NON-VOLATILE MEMORY CELLS, the disclosures of which are hereby incorporated by reference herein in their respective entireties and for all purposes.

TECHNICAL FIELD

The subject disclosure relates generally to circuitry comprising resistive switching memory, and as one illustrative example, a programmable, high-speed network routing device utilizing arrays of non-volatile two-terminal.

BACKGROUND

The inventor(s) of the present disclosure has proposed models of two-terminal memory devices that he expects to operate as viable alternatives to various memory cell technologies, such as metal-oxide semiconductor (MOS) type memory cells employed for electronic storage of digital information. Models of memory cells using two-terminal memory such as resistive-switching memory devices among others, are believed by the inventor(s) to provide some potential advantages over purely non-volatile FLASH MOS type transistors, including smaller die size, higher memory density, faster switching (e.g., from active to de-active, or vice versa), good data reliability, low manufacturing cost, fab-compatible processes, and other advantages, for example.

SUMMARY

The following presents a simplified summary of the specification in order to provide a basic understanding of some aspects of the specification. This summary is not an extensive overview of the specification. It is intended to neither identify key or critical elements of the specification nor delineate the scope of any particular embodiments of the specification, or any scope of the claims. Its purpose is to present some concepts of the specification in a simplified form as a prelude to the more detailed description that is presented in this disclosure.

In one or more disclosed embodiments, provided is circuitry for implementing a high speed, reprogrammable network router device having non-volatile memory for storage of network addresses and associated downstream port assignments and forwarding addresses. In various embodiments, one or more address-matching circuits are provided that store, in reprogrammable non-volatile memory, bit patterns that are respectively associated with one or more network addresses. The address-matching circuit generates one or more outputs matching a received network address, which can be decoded by a priority decoder. A selected matched output can be provided to a port-mapping circuit to identify a downstream port for the network address, and can be provided to a forward address-mapping circuit to identify a forwarding address, if any, for the network address. The network router device can then transmit a data packet received at the network router device according to the identified downstream port and, where applicable, according to the forwarding address. Some embodiments provide multiple arrays to facilitate parallel address-mapping operations (or port-mapping, or forward address-mapping operations), updating bit pattern/network address associations in parallel with data packet processing, among other techniques.

Various non-volatile memory devices can be utilized to achieve target performance metrics for one or more logic applications, depending on capabilities of the non-volatile memory device chosen. Suitable non-volatile memory devices can include two-terminal memory devices. Examples can include, but are not limited to, resistive-switching memory, phase-change memory, magneto-resistive memory, conductive-bridging memory, and so on. In particular embodiments, two-terminal resistive switching non-volatile memory cells can be employed to achieve a high on/off current ratio (e.g., three or four orders of magnitude, or greater), a fast switching speed (e.g., hundreds of nanoseconds, or less), among other characteristics.

In still other embodiments, disclosed is a distribution circuit for a router device. The distribution circuit can be programmed to identify a set of incoming client identifiers (e.g., identification codes, device codes, Internet Protocol addresses, MAC addresses, etc.) and programmed to associate a set of downstream distribution nodes with subsets of the incoming client identifiers. As one example, a distribution circuit can comprise a logical AND circuit that can be programmed to identify a set of received client IP addresses and a logical NOR circuit that can be programmed to determine a suitable downstream distribution node for respective client IP addresses, and a second logical NOR circuit that can be programmed to determine a forwarding address for at least a subset of client IP addresses. Thus, a network router utilizing the distribution circuit can enter an IP address at an input to the logical AND circuit, and retrieve a downstream distribution node for the IP address as an output of the logical NOR circuit, and optionally retrieve a forward address for the IP address as an output of the second logical NOR circuit. Such a distribution circuit can achieve lookup times of about several nanoseconds, or less, which can be far faster than conventional devices. Further, the distribution circuit can utilize a priority encoder that resolves conflicts between multiple IP address identifications, allowing multiple IP addresses to be assigned to a single metal line of the distribution circuit. This allows the distribution circuit to have smaller numbers of metal lines for a given set of mapped addresses, reducing a footprint of the distribution circuit. Moreover, because the distribution circuit utilizes non-volatile memory, the programmability can be resistant or immune to memory loss due to loss of power, or other temporal conditions. Conventional devices utilizing DRAM or SRAM for storing data cannot easily achieve this resistance to data loss.

In an embodiment, the subject disclosure provides a method for operating a network router device. The method can comprise receiving a data packet comprising a network address at an input interface of the network router device and entering the network address onto a set of input signal lines of the network router device. Further, the method can comprise generating one or more address-matched output signals on a set of output signal lines in response to the network address matching one or more bit pattern addresses stored at the set of output signal lines and generating a single address-matched output signal from the one or more address-matched output signals. In addition to the foregoing, the method can comprise inputting the single address-matched output signal to a set of downstream port lines of the network router device in response to entering the network address and measuring output signals of the set of downstream port lines in response to inputting the single address-matched output signal to the set of downstream port lines. Still further, the method can comprise identifying a downstream port line of the set of downstream port lines that is associated with the network address from measured output signals of the set of downstream port lines and transmitting the data packet on a downstream port associated with the downstream port line.

In one or more embodiments, the subject disclosure provides a network router device. The network router device can comprise an address-matching circuit having a plurality of input lines including an input line and having a plurality of output lines including an output line. In addition, each intersection of the plurality of input lines with the output line comprises a non-volatile memory circuit of a group of non-volatile memory circuits that are reversibly programmable to store a pattern of bits that match a plurality of network addresses. Additionally, the output line is configured to provide a default voltage in response to input by the network router device of a network address of the plurality of network addresses on the plurality of input lines. Moreover, the network router device can comprise a priority encoder configured to select a single matched output among multiple default voltage outputs from the plurality of output lines in response to input of the one of the plurality of network addresses. Further to the foregoing, the network router device can comprise a port-mapping circuit configured to identify a downstream port mapped to the single matched output, wherein the network router device transmits a received data packet addressed to the network address on the downstream port in response to the port-mapping circuit identifying the downstream port.

The following description and the drawings set forth certain illustrative aspects of the specification. These aspects are indicative, however, of but a few of the various ways in which the principles of the specification may be employed. Other advantages and novel features of the specification will become apparent from the following detailed description of the specification when considered in conjunction with the drawings.

BRIEF DESCRIPTION OF THE DRAWINGS

Various aspects or features of this disclosure are described with reference to the drawings, wherein like reference numerals are used to refer to like elements throughout. In this specification, numerous specific details are set forth in order to provide a thorough understanding of this disclosure. It should be understood, however, that certain aspects of the subject disclosure may be practiced without these specific details, or with other methods, components, materials, etc. In other instances, well-known structures and devices are shown in block diagram form to facilitate describing the subject disclosure.

DETAILED DESCRIPTION

Figure 1:
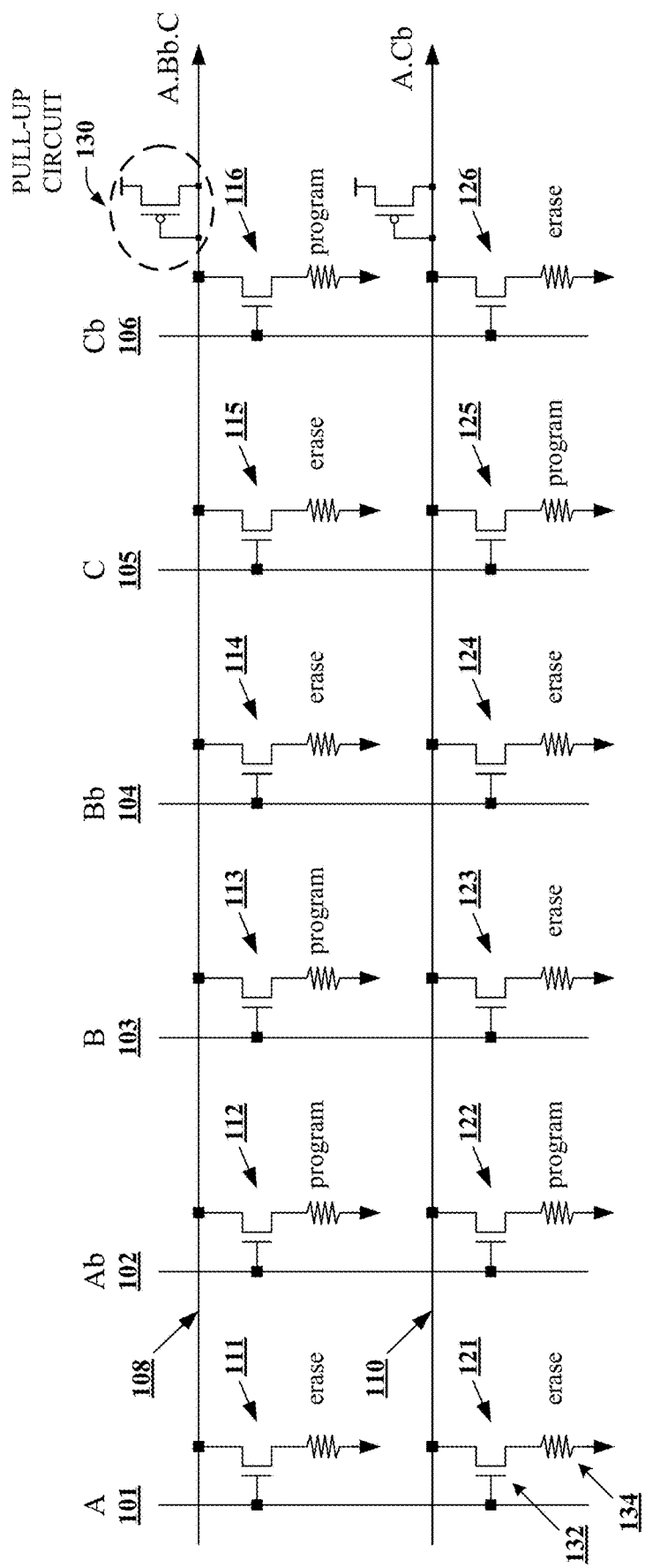
FIG. 1 illustrates a schematic diagram of a sample programmable circuit that generates an output in response to matching an input, in an embodiment.

This disclosure relates to a programmable circuit configurable to perform logic functions, according to various embodiments. The programmable circuit can employ two-terminal non-volatile memory devices to store information, thereby mitigating or avoiding disturbance of programmed data in the absence of external power. Moreover, the programmable circuit can employ two-terminal resistive switching memory devices, in some embodiments, having high current on/off ratios and fast switching times. The high current on/off ratios can suppress leakage current, facilitating a high density array capable of storing large quantities of data. Moreover, the fast switching times facilitate responsive programming and re-programming, a desirable characteristic for many modern electronic applications, such as networking and computing devices. In addition, input/output response times can be several nanoseconds or less, facilitating much faster response times than an array access, employed in some conventional devices.

Referring more generally to the disclosed embodiments, two-terminal memory cells can include a resistive technology, such as a resistive-switching two-terminal memory cell.

Resistive-switching two-terminal memory cells (also referred to as resistive-switching memory cells or resistive-switching memory), as utilized herein, comprise circuit components having a pair of conductive contacts with an active region between the conductive contacts. The active region of the two-terminal memory device, in the context of resistive-switching memory, exhibits a plurality of stable or semi-stable resistive states, each resistive state having a distinct electrical resistance. Moreover, respective ones of the plurality of states can be formed or activated in response to a suitable electrical signal applied at the conductive contacts. These electrical signals can be selected to have suitable characteristics, such as a voltage or current value, a voltage or current polarity, a field strength, a field polarity, or the like, or a suitable combination thereof. Examples of a resistive switching two-terminal memory device, though not exhaustive, can include a resistive random access memory (RRAM), a phase change RAM (PCRAM) and a magnetic RAM (MRAM).

Programmable arrays described in the subject disclosure can be filamentary-based devices, in various embodiments, including, e.g., a non-volatile memory device, a volatile selector device, a combination of the foregoing, or a similar device. Composition of filamentary-based devices can vary per device, with different components selected to achieve desired characteristics (e.g., volatility/non-volatility, on/off current ratio, switching time, read time, memory durability, program/erase cycle, and so on). One example of a filamentary-based device can comprise: a conductive layer, e.g., metal, metal-alloy, metal-nitride, (e.g., comprising TiN, TaN, TiW, or other suitable metal compounds), an optional interface layer (e.g., doped p-type (or n-type) silicon (Si) bearing layer (e.g., a p-type or n-type Si bearing layer, p-type or n-type polysilicon, p-type or n-type polycrystalline SiGe, etc.)), a resistive switching layer (RSL) and an active metal-containing layer capable of being ionized. Under suitable conditions, the active metal-containing layer can provide filament-forming ions to the RSL. In such embodiments, a conductive filament (e.g., formed by the ions) can facilitate electrical conductivity through at least a subset of the RSL, and a resistance of the filament-based device can be determined, as one example, by a tunneling resistance between the filament and the conductive layer.

A RSL (which can also be referred to in the art as a resistive switching media (RSM)) can comprise, e.g., an undoped amorphous Si-containing layer, a semiconductor layer having intrinsic characteristics, a silicon nitride (e.g., SiN, Si3N4, SiNx, etc.), a Si sub-oxide (e.g., SiOx wherein x has a value between 0.1 and 2), a Si sub-nitride, a metal oxide, a metal nitride, a non-stoichiometric silicon compound, and so forth. Other examples of materials suitable for the RSL could include SixGeyOz (where x, y and z are respective suitable positive numbers), a silicon oxide (e.g., SiON, where N is a suitable positive number), a silicon oxynitride, an undoped amorphous Si (a-Si), amorphous SiGe (a-SiGe), TaOB (where B is a suitable positive number), HfOC (where C is a suitable positive number), TiOD (where D is a suitable number), Al2OE (where E is a suitable positive number) and so forth, a nitride (e.g. AlN, SiN), or a suitable combination thereof.

In some embodiments, a RSL employed as part of a non-volatile memory device (non-volatile RSL) can include a relatively large number (e.g., compared to a volatile selector device) of material voids or defects to trap neutral metal particles (at least at low voltage) within the RSL. The large number of voids or defects can facilitate formation of a thick, stable structure of the neutral metal particles. In such a structure, these trapped particles can maintain the non-volatile memory device in a low resistance state in the absence of an external stimulus (e.g., electrical power), thereby achieving non-volatile operation. In other embodiments, a RSL employed for a volatile selector device (volatile RSL) can have very few material voids or defects. Because of the few particle-trapping voids/defects, a conductive filament formed in such an RSL can be quite thin, and unstable absent a suitably high external stimulus (e.g., an electric field, voltage, current, joule heating, or a suitable combination thereof). Moreover, the particles can be selected to have high surface energy, and good diffusivity within the RSL. This leads to a conductive filament that can form rapidly in response to a suitable stimulus, but also deform quite readily, e.g., in response to the external stimulus dropping below a deformation magnitude. Note that a volatile RSL and conductive filament for the selector device can have different electrical characteristics than a conductive filament and non-volatile RSL for the non-volatile memory device. For instance, the selector device RSL can have higher material electrical resistance, and can have higher on/off current ratio, among others.

An active metal-containing layer for a filamentary-based memory cell can include, among others: silver (Ag), gold (Au), titanium (Ti), titanium-nitride (TiN) or other suitable compounds of titanium, nickel (Ni), copper (Cu), aluminum (Al), chromium (Cr), tantalum (Ta), iron (Fe), manganese (Mn), tungsten (W), vanadium (V), cobalt (Co), platinum (Pt), hafnium (Hf), and palladium (Pd). Other suitable conductive materials, as well as compounds, nitrides, oxides, alloys, or combinations of the foregoing or similar materials can be employed for the active metal-containing layer in some aspects of the subject disclosure. Further, a non-stoichiometric compound, such as a non-stoichiometric metal oxide or metal nitride (e.g., AlOx, AlNx, CuOx, CuNx, AgOx, AgNx, and so forth, where x is a suitable positive number $0<x<2$, which can have differing values for differing ones of the non-stoichiometric compounds) or other suitable metal compound can be employed for the active metal-containing layer, in at least one embodiment.

In one or more embodiments, a disclosed filamentary resistive switching device can include an active metal layer comprising a metal nitride selected from the group consisting of: TiNx, TaNx, AlNx, CuNx, WNx and AgNx, where x is a positive number. In a further embodiment(s), the active metal layer can comprise a metal oxide selected from the group consisting of: TiOx, TaOx, AlOx, CuOx, WOx and AgOx. In yet another embodiment(s), the active metal layer can comprise a metal oxi-nitride selected from the group consisting of: TiOaNb, AlOaNb, CuOaNb, WOaNb and AgOaNb, where a and b are positive numbers. The disclosed filamentary resistive switching device can further comprise a switching layer comprising a switching material selected from the group consisting of: SiOy, AlNy, TiOy, TaOy, AlOy, CuOy, TiNx, TiNy, TaNx, TaNy, SiOx, SiNy, AlNx, CuNx, CuNy, AgNx, AgNy, TiOx, TaOx, AlOx, CuOx, AgOx, and AgOy, where x and y are positive numbers, and y is larger than x. Various combinations of the above are envisioned and contemplated within the scope of embodiments of the present invention.

In one example, a disclosed filamentary resistive switching device comprises a particle donor layer (e.g., the active metal-containing layer) comprising a metal compound and a resistive switching layer. In one alternative embodiment of this example, the particle donor layer comprises a metal nitride: MNx, e.g., AgNx, TiNx, AlNx, etc., and the resistive switching layer comprises a metal nitride: MNy, e.g., AgOy, TiOy, AlOy, and so forth, where y and x are positive numbers, and in some cases y is larger than x. In an alternative embodiment of this example, the particle donor layer comprises a metal oxide: MOx, e.g., AgOx, TiOx, AlOx, and so on, and the resistive switching layer comprises a metal oxide: MOy, e.g., AgOy, TiOy, AlOy, or the like, where y and x are positive numbers, and in some cases y is larger than x. In yet another alternative, the metal compound of the particle donor layer is a MNx (e.g., AgNx, TiNx, AlNx, etc.), and the resistive switching layer is selected from a group consisting of MOy (e.g., AgOy, TiOy, AlOy, etc.) and SiOy, where x and y are typically non-stoichiometric values, or vice versa in a still further embodiment.

As utilized herein, variables x, a, b, and so forth representative of values or ratios of one element with respect to another (or others) in a compound can have different values suitable for respective compounds, and are not intended to denote a same or similar value or ratio among the compounds. Some details pertaining to embodiments of the subject disclosure similar to the foregoing example(s) can be found in the following U.S. patent applications that are licensed to the assignee of the present application for patent: application Ser. No. 11/875,541 filed Oct. 19, 2007 and application Ser. No. 12/575,921 filed Oct. 8, 2009, and the following U.S. patent application assigned to the assignee of the present application for patent: application Ser. No. 14/588,185 filed Dec. 31, 2014; each of the foregoing patent applications are hereby incorporated by reference herein in their respective entireties and for all purposes.

It should be appreciated that various embodiments herein may utilize a variety of memory cell technologies, having different physical properties. For instance, different resistive-switching memory cell technologies can have different discrete programmable resistances, different associated program/erase voltages, as well as other differentiating characteristics. For instance, various embodiments of the subject disclosure can employ a bipolar switching device that exhibits a first switching response (e.g., programming to one of a set of program states) to an electrical signal of a first polarity and a second switching response (e.g., erasing to an erase state) to the electrical signal having a second polarity. The bipolar switching device is contrasted, for instance, with a unipolar device that exhibits both the first switching response (e.g., programming) and the second switching response (e.g., erasing) in response to electrical signals having the same polarity and different magnitudes.

In various embodiments, filamentary-based resistance switching devices can operate in a bipolar fashion, behaving differently in response to different polarity (or direction, energy flow, energy source orientation, etc.) external stimuli. For the volatile filamentary-based selector device, as an illustrative example, in response to a first polarity stimulus exceeding a first threshold voltage (or set of voltages), the filamentary selector device can change to a second resistance state from a first resistance state. Moreover, in response to a second polarity stimulus exceeding a second threshold voltage(s), the filamentary selector device can change to a third state from the first state. In some embodiments, the third state can be substantially the same as the first state, having the same or similar measurably distinct characteristic (e.g., electrical conductivity, and so forth), having the same or similar magnitude of threshold stimulus (though of opposite polarity or direction), or the like. In other embodiments, the third state can be distinct from the second state, either in terms of the measurable characteristic (e.g., different electrically conductivity value in response to the reverse polarity as compared to the forward polarity) or in terms of threshold stimulus associated with transitioning out of the first state (e.g., a different magnitude of positive voltage required to transition to the second state, compared to a magnitude of negative voltage required to transition to the third state).

For bipolar operation of a non-volatile filamentary-based memory cell, a conductive path or a filament forms through a non-volatile RSL in response to a suitable program voltage applied across the memory cell. In particular, upon application of a programming voltage, metallic ions are generated from the active metal-containing layer and migrate into the non-volatile RSL layer. The metallic ions can occupy voids or defect sites within the non-volatile RSL layer. In some embodiments, upon removal of the bias voltage, the metallic ions become neutral metal particles and remain trapped in voids or defects of the non-volatile RSL layer. When sufficient particles become trapped, a filament is formed and the memory cell switches from a relatively high resistive state, to a relatively low resistive state. More specifically, the trapped metal particles provide the conductive path or filament through the non-volatile RSL layer, and the resistance is typically determined by a tunneling resistance through the non-volatile RSL layer. In some resistive-switching devices, an erase process can be implemented to deform the conductive filament, at least in part, causing the memory cell to return to the high resistive state from the low resistive state. More specifically, upon application of an erase bias voltage, the metallic particles trapped in voids or defects of the non-volatile RSL become mobile ions and migrate back towards the active metal layer. This change of state, in the context of memory, can be associated with respective states of a binary bit. For an array of multiple memory cells, a word(s), byte(s), page(s), block(s), etc., of memory cells can be programmed or erased to represent zeroes or ones of binary information, and by retaining those states over time in effect storing the binary information. In various embodiments, multi-level information (e.g., multiple bits) may be stored in such memory cells.

Where no specific memory cell technology or program/erase voltage is specified for the various aspects and embodiments herein, it is intended that such aspects and embodiments incorporate any suitable memory cell technology and be operated by program/erase voltages appropriate to that technology, as would be known by one of ordinary skill in the art or made known to one of ordinary skill by way of the context provided herein. It should be appreciated further that where substituting a different memory cell technology would require circuit modifications that would be known to one of ordinary skill in the art, or changes to operating signal levels that would be known to one of such skill, embodiments comprising the substituted memory cell technology(ies) or signal level changes are considered within the scope of the subject disclosure.

FIG. 1 depicts an example programmable logic circuit comprising a 1T1R array with programmable logical AND operation 100. The programmable logic circuit comprises a set of input lines, including input lines: A 101, Ab 102, B 103, Bb 104, C 105 and Cb 106 (referred to collectively as input lines 101-106), a set of output lines, including output lines 108, 110, and sets of memory circuits associated with the respective output lines 108, 110, including a first set of memory circuits: 111, 112, 113, 114, 115, and 116 (referred to collectively as memory circuits 111-116) and a second set of memory circuits: 121, 122, 123, 124, 125 and 126 (referred to collectively as memory circuits 121-126). The subject disclosure is not limited to the example depicted by FIG. 1, however; rather other numbers of input signals, output signals and memory circuits are considered to be within the scope of the subject disclosure. For instance, a suitable number of memory circuits 111-116 can be provided for output line 108 to accommodate a second number of bits of network addresses being input to programmable logic circuit 100. As a particular example, to program a 128-bit network address to output line 108, memory circuits 111-116 can comprise at least 256 memory circuits, including one memory circuit for each bit (e.g., bit A, . . . ) and one memory circuit for each inverse bit (e.g., bit A bar—also referred to herein as Ab—and so forth). Likewise, at least as many input lines 101-06 matching the address bits and inverse address bits for the network addresses can be provided. Moreover, programmable logic circuit 100 can comprise many output lines 108, 110, at least one for each network address managed by a disclosed network router device, and additional unprogrammed output lines to which newly added network addresses can be added (e.g., see FIG. 5A, infra). Further, memory circuits 111-116, 121-126 of output lines 108, 110 can be reprogrammed from an existing pattern to a new pattern.

In addition to the foregoing, the programmable logic circuit 100 can comprise a set of pull-up circuits, including pull-up circuits 130. Each of output lines 108, 110 is connected to a pull-up circuit 130, which can be configured to apply a default voltage (e.g., a supply voltage, a voltage between about 1 volts and about 3 volts, or other suitable magnitude or range of magnitudes) to respective output lines 108, 110. In an embodiment(s), memory circuits 111-116 and 121-126 are configured to pull down this voltage to a low value on output line 108 and 110, respectively, in response to a network address being entered on input lines 101-106 that does not match a program pattern of memory circuits 111-116 and memory circuits 121-126, respectively. An address that matches a program pattern does not pull down the voltage on the output line 108, 110, as described in more detail herein. Thus, the voltage on output lines 108, 110 is determinative of whether an address input on input lines 101-106 matches an address programmed to memory circuits on output lines 108, 110.

Memory circuits 111-116, 121-126 comprise a transistor 132 (e.g., an NMOS transistor) and a two-terminal resistive-switching memory 134 (with reference to memory circuit 121). The transistor has a gate connected to one of input lines 101-106, a source connected to one of output lines 108, and a drain connected to a first terminal of the two-terminal resistive-switching memory 134. A second terminal of the two-terminal resistive-switching memory 134 is connected to ground. In response to a high signal on an associated input line (e.g., input line A 101), transistor 132 activates and conducts current between the source and the drain. Thus, when transistor 132 is activated, the default voltage supplied by one of pull-up circuits 130 is applied to the first terminal of two-terminal resistive-switching memory 134. In various embodiments, the default voltage can have a magnitude equal to or larger than a read voltage associated with two-terminal resistive-switching memory 134, and smaller than a program voltage associated with two-terminal resistive-switching memory 134. Accordingly, the default voltage will not change a program state of two-terminal resistive-switching memory 134, but will generate an on-state current if two-terminal resistive-switching memory 134 is in a program state (e.g., a low resistance state), causing a voltage divider effect and reducing the default voltage on an associated output line 108, 108, thereby reducing the default voltage to a low voltage value (e.g., less than a few tenths of a volt, less than 75% or 80% of the default voltage, or any suitable voltage measurably smaller than the default voltage, as a few examples). In contrast, where an input line has a low voltage (deactivating transistor 132), or where a two-terminal resistive-switching memory 134 is erased (e.g., a high resistance state), the default voltage on the output line is unaffected, or substantially unaffected.

Two-terminal resistive-switching memory devices 134 of memory circuits 111-116 and 121-126 can be reversibly programmed to store respective memory patterns. The two-terminal resistive-switching memory devices 134 can be erased to deprogram an output line 108, 110, or can be reprogrammed or overwritten to store a new memory pattern to the output line 108, 110. In the example depicted by FIG. 1, memory circuits 111-116 are programmed to the following memory pattern: E-P-P-E-E-P (from left to right). According to this pattern, memory circuits that have both a high signal on an associated one of input lines 101-106 and have a programmed two-terminal resistive-switching memory 134 will pull down a default voltage on an associated output line 108, 110 to the low voltage. Memory circuits that have either a low signal on an associated input line 101-106, or that have an erased two-terminal resistive-switching memory 134 will not affect (or not substantially affect) the default voltage on the associated output line 108, 110. Accordingly, a high signal on input lines A 101, Bb 104 and C 105 (e.g., an input signal that satisfies a logical AND of input lines 101, 104 and 105), and low signals on the inverse of these signals: Ab 102, B 103 and Cb 106, will result in the default voltage on output line 108, verifying a logical AND at output line 108, indicating that such an address provided to input lines 101-106 matches a pattern programmed to memory circuits 111-116. A high signal on any of Ab 102, B 103 or Cb 106 (e.g., an input that does not satisfy a logical AND of input lines 101, 104 and 105) will reduce the default voltage to the low voltage on output line 108, invalidating the logical AND on output line 108. Such a result indicates that the address provided on input lines 101-106 does not match the pattern programmed to memory circuits 111-116.

Memory circuits 121-126 are programmed to a second memory pattern: E-P-E-E-P-E (from left to right). Memory circuit pair 123 and 124 corresponding to input B 103 and Bb 104 both being in an erased state indicates that the input B does not affect the logical AND function and therefore has no impact on output line 110. Thus, in more general terms, memory circuits 121-126 in an erased state (e.g., a high resistance state) do not affect output line 110 regardless of the input lines 101-106. For the second memory pattern depicted by FIG. 1 then, inputs A 101, B 103, Bb 104, and Cb 106 will not pull down the default voltage on the output line 110. Only memory circuits 122 and 126 being in a programmed state (having low resistance) can affect the default voltage on the output line 110. A high signal on either of input lines Ab 102 or C 105 will result in the output line 110 being pulled to a low state. Otherwise, the output line 110 remains in its default state of high. Worded differently, low signals on Ab 102 and C 105 will result in output line 110 retaining its default state of high which corresponds to a logical (A, Cb) operation.

Figure 2:
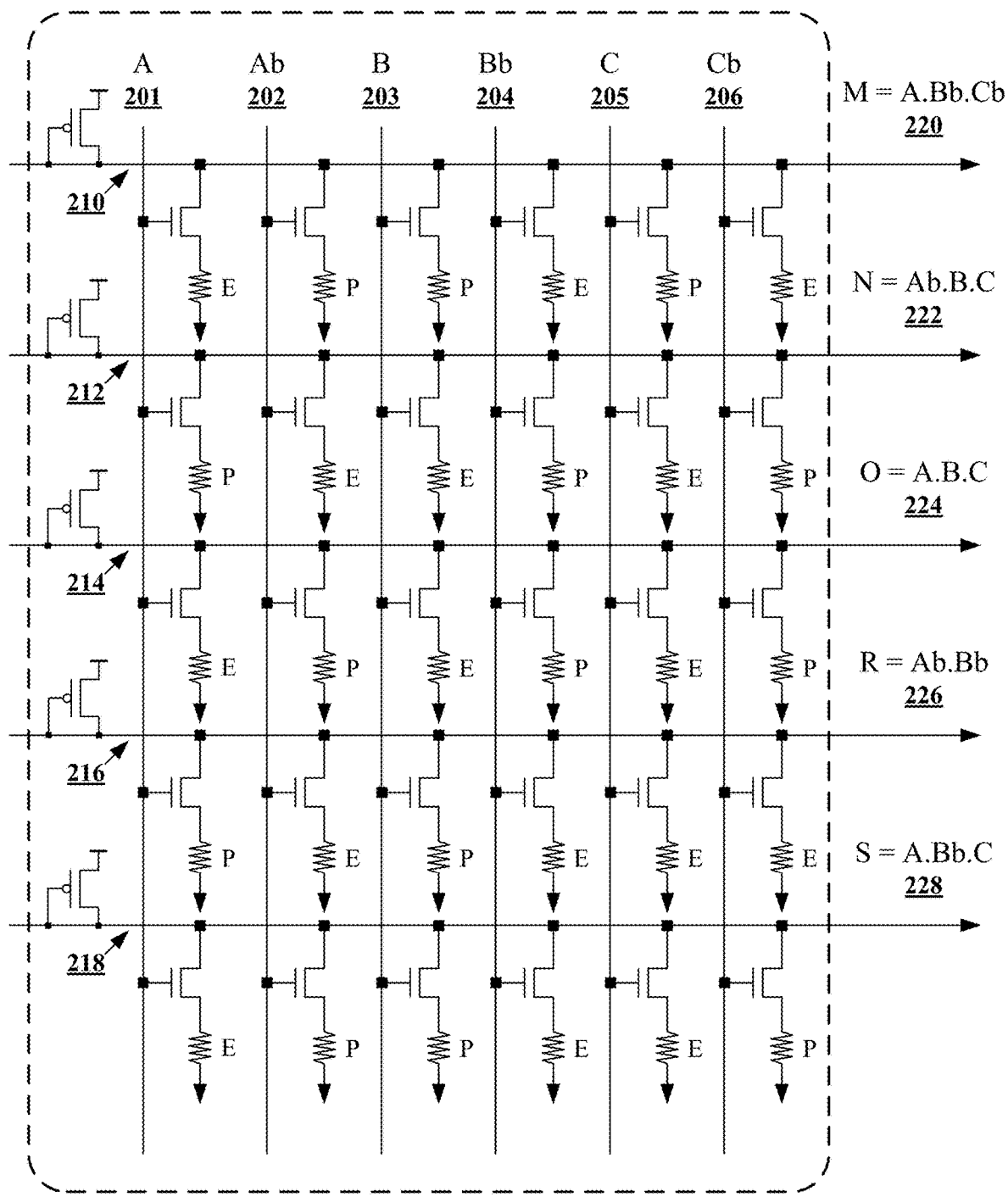
FIG. 2 depicts a schematic diagram of an example programmable address-matching circuit for a network router device, according to some embodiments.
Figure 3:
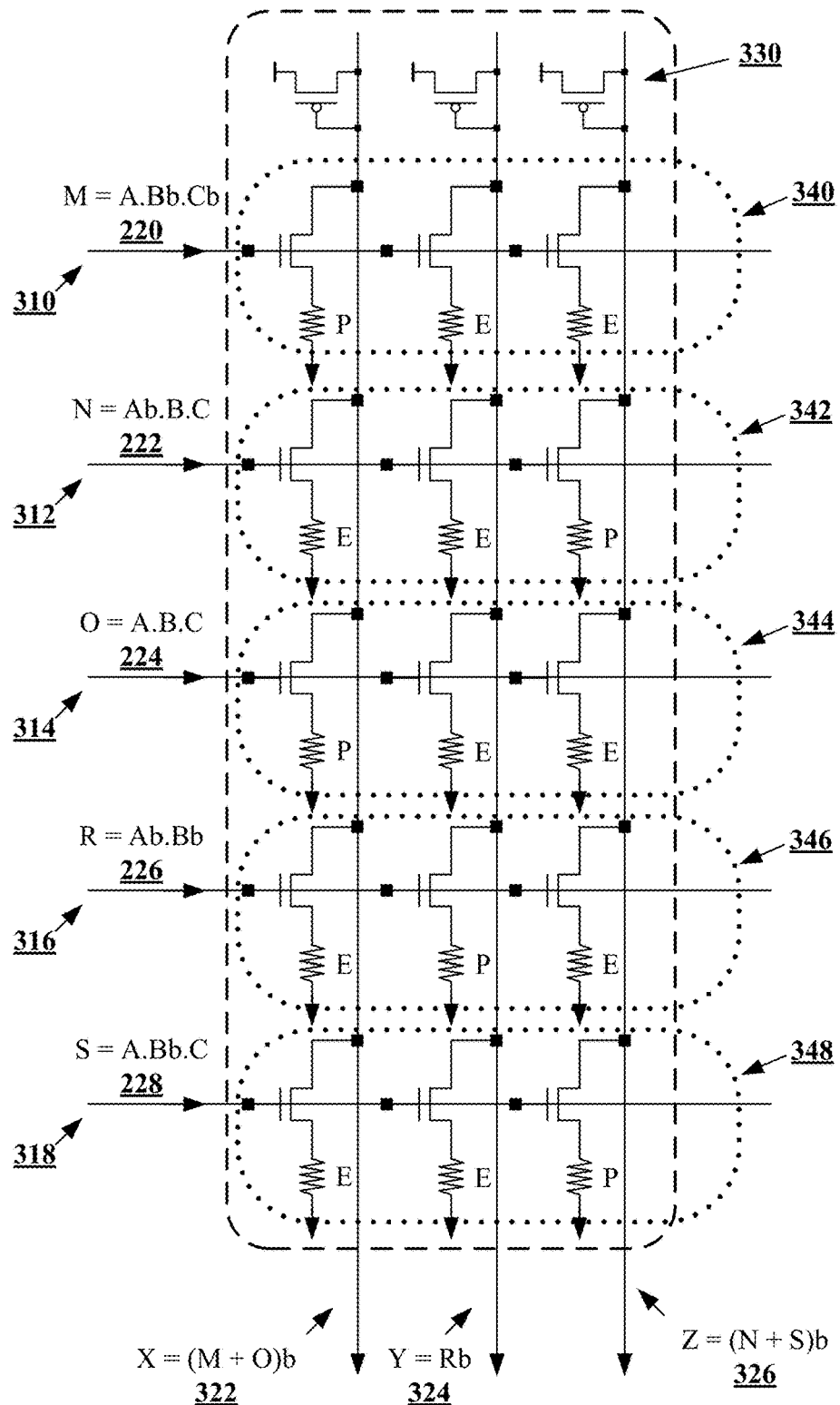
FIG. 3 depicts a schematic diagram of an example programmable port-mapping circuit for a network router device, in an embodiment.

FIGS. 2 and 3 depict schematic diagrams of a circuit 200 configured to implement a logical AND operation, and a circuit 300 configured to implement a logical NOR operation, respectively. In one or more embodiments, circuits 200 and 300 can be integrated to implement a programmable, high-speed lookup table. The lookup table can be utilized for a variety of applications. In one example embodiment, the lookup table can store a set of network addresses at circuit 200, and can correlate subsets of the network addresses with a set of downstream port addresses at circuit 300. This can be utilized in a network routing device, for instance, to retrieve a downstream port address for a received packet. A process (e.g., a processor implementing the process) can extract a destination IP address from the received packet, enter the destination IP address as an input to circuit 200, and retrieve the downstream port address as an output from circuit 300. In further embodiments, circuit 200 and 300 can utilize non-volatile resistive-switching memory cells to store the network addresses and downstream port addresses. This can render the routing device resistant to loss of data from a power outage, as an example. Further, because the memory cells are programmable, new addresses can be added, old addresses can be overwritten, an existing address(es) can be routed to a different downstream port(s) and so on, by programming suitable subsets of the memory cells. Moreover, because the lookup table is implemented in hardware, DRAM read operations (employed by many conventional routing devices) are not required to retrieve a downstream port address. Rather, output nodes of circuit 300 can be sampled to determine the downstream port address, which can be implemented much more quickly than multiple DRAM read operations. In some embodiments, the downstream port address can be acquired in a few nanoseconds (e.g., 5 nanoseconds), as opposed to tens of nanoseconds, resulting in higher performance for the routing device.

Circuit 200 comprises a set of input lines, including input lines: A 201, Ab 202, B 203, Bb 204, C 205 and Cb 206 (referred to collectively as input lines 201-206). Intersecting input lines 201-206 is a set of output lines: 210, 212, 214, 216 and 218 (referred to collectively as output lines 210-218). Output lines 210-218 have a default voltage applied by an associated pull-up circuit as an initial condition for output lines 210-218. Sets of memory cells at respective output lines 210-218 can be programmed to store different program patterns. These program patterns can represent any suitable data entity, depending on application (e.g., a network address or IP address for an address lookup application, or other suitable data entity for other applications). As described herein, an input signal provided at signal inputs 201-206 can change the default voltage on at least a subset of output lines 210-218. Particularly, a signal input that does not match a program pattern stored by memory cells at one of output lines 210-218, will pull down (e.g., reduce) the default voltage on that output line, and any other output line having a program pattern that does not match the signal input. Only an output line(s) with memory cells having a stored data pattern that matches the signal input will remain at the default voltage.

In the example illustrated by circuit 200, each of output lines 210-218 is associated with a distinct program pattern. Output line 210 has a first program pattern equal to A.Bb.Cb; an output signal M 220 of output line 210 equals the default voltage in response to an input signal matching the first program pattern, and is a reduced voltage otherwise. Similarly, output line 212 has an output signal N 222 associated with a second program pattern equal to Ab.B.C; output line 214 has an output signal O 224 associated with a third program pattern equal to A.B.C; output line 216 has an output signal R 226 associated with a fourth program pattern equal to Ab.Bb; output line 218 has an output signal S 228 associated with a fifth program pattern equal to A.Bb.C. Similar to output signal M 620, any of output signals N 222, O 224, R 226 and S 228 equal the default voltage in response to an input signal matching an associated program pattern, and at the reduced voltage otherwise.

Referring now to FIG. 3, a circuit 300 is depicted that receives output signals M 220, N 222, O 224, R 226 and S 228 (referred to collectively as output signals 220-228) as inputs, and determines an output of a set of programmable outputs in response to a state of the inputs. The output signals 220-228 are received on a set of input lines: 310, 312, 314, 316 and 318 (referred to collectively as input lines 310-318). Input lines 310-318 are respectively connected to respective output lines 210-218 of circuit 200, to facilitate transfer of output signals 220-228 to circuit 300. In addition to input lines 310-318, circuit 300 comprises a set of NOR outputs: X 322, Y 324 and Z 326 (referred to collectively as NOR outputs 322-326). NOR outputs 322-326 are initialized at a high voltage by respective pull-up circuits 330, which can be affected by sets of programmable memory circuits 340, 342, 344, 346 and 358 (referred to collectively as memory circuits 340-348). In some embodiments, circuit 300 can be configured such that a selected NOR output (e.g., determinative of a downstream port address associated with a network address input at signal inputs 201-206 of circuit 200) is defined as one of NOR outputs 322-326 that changes from the high, initialized voltage to a low voltage in response to receipt of output signals 220-228. In other embodiments, circuit 300 can be configured such that the selected NOR output is defined as the NOR output that remains at the high initialized voltage in response to receipt of output signals 220-228—depending on the programming patterns of the sets of memory circuits.

Each memory circuit of the sets of programmable memory circuits 340-348 comprises a transistor and a two-terminal resistive-switching memory. A source of the transistor is connected to one of NOR outputs 322-326, and a drain of the transistor is connected to a first terminal of an associated two-terminal resistive-switching memory. The gate of the transistor is connected to one of input lines 310-318, and the second terminal of the two-terminal resistive-switching memory is connected to ground. In response to a high voltage (e.g., the default voltage) on an associated one of input lines 310-316, the transistor is activated connecting the NOR output to the first terminal of the two-terminal resistive-switching memory. If the memory is programmed (e.g., low resistance state), activation of the transistor provides a low resistance path to ground in parallel to the NOR output. This low resistance path to ground effectively reduces the initial high voltage on the NOR output. If the memory is erased (e.g., high resistance state), little current flows through the memory circuit, maintaining (or substantially maintaining) the initial high voltage on the NOR output.

By programming only a single memory circuit of each set of programmable memory circuits 340-348, each input line 310-318 is correlated with a reduced voltage on only one of NOR outputs 322-326 (the NOR output connected to the programmed memory circuit). In some embodiments, only a single memory circuit of each set of programmable memory circuits 340-348 is erased; in this case, each input line 310-318 is correlated with the initial high voltage on only one of NOR outputs 322-326 (the NOR output connected to the erased memory circuit). With either convention, respective subsets of input lines 310-318 can be correlated to respective ones of NOR outputs 322-326, such that the default voltage at one of output signals 220-228 can be correlated to one of NOR outputs 322-326, for each of output signals 220-228. For some applications, however, each input line 310-318 can be correlated with multiple NOR outputs 322-326, or no NOR outputs 322-326, depending on programming of sets of memory circuits 340-348.

High or low voltages on NOR outputs 322-326 are referred to as NOR output signals, and include NOR output signals X, Y and Z. For the example illustrated by FIG. 3, output signals M 220 and O 224 are correlated with a low voltage NOR output signal X on NOR output 322 (thus, Xb corresponds with M 220 and O 224; or in different form: X correlates to (M+O)b). Likewise, output signal R 226 is correlated with a low voltage NOR output signal Y, and output signals N 222 and S 228 are correlated with a low voltage NOR output signal Z.

In continuing the example router device application described above, respective NOR outputs 322-326 can be associated with respective downstream port addresses. When one of NOR outputs 322-326 changes to a low voltage (or maintains a high voltage, depending on programming) in response to an input at circuit 200, that NOR output and its associated downstream port address is selected by circuit 300. Association of network addresses (represented by output signals 220-228) and downstream port addresses can be changed by reprogramming sets of memory circuits 340-348. By expanding circuit 300, additional input lines 310-318 can be provided to accommodate larger numbers of network addresses. Likewise, additional NOR outputs 322-326 can be provided to accommodate larger numbers of downstream port addresses. Some sets of memory circuits 340-348 can be left unprogrammed, while other sets of memory circuits 340-348 are programmed, where fewer network addresses are available than input lines 312-318. Unprogrammed sets of memory circuits 340-348 can be later programmed to reflect added network address program patterns at circuit 200, for instance, and associate the added network address to a downstream port address. Further, where more NOR outputs 322-326 than downstream port addresses exist, one or more memory circuits for each set of memory circuits 342-348 can be left unprogrammed and the extra NOR outputs 322-326 can be unassigned to a downstream port address. If additional downstream port addresses are later associated with the extra NOR outputs 322-326, the one or more memory circuits connected to the extra NOR outputs 322-326 can then be programmed. Thus, circuits 200 and 300 can provide a lookup table that can store address data, and downstream port associations, and further can be expanded to accommodate more (or contracted to accommodate fewer) addresses or downstream port associations.

Figure 4:
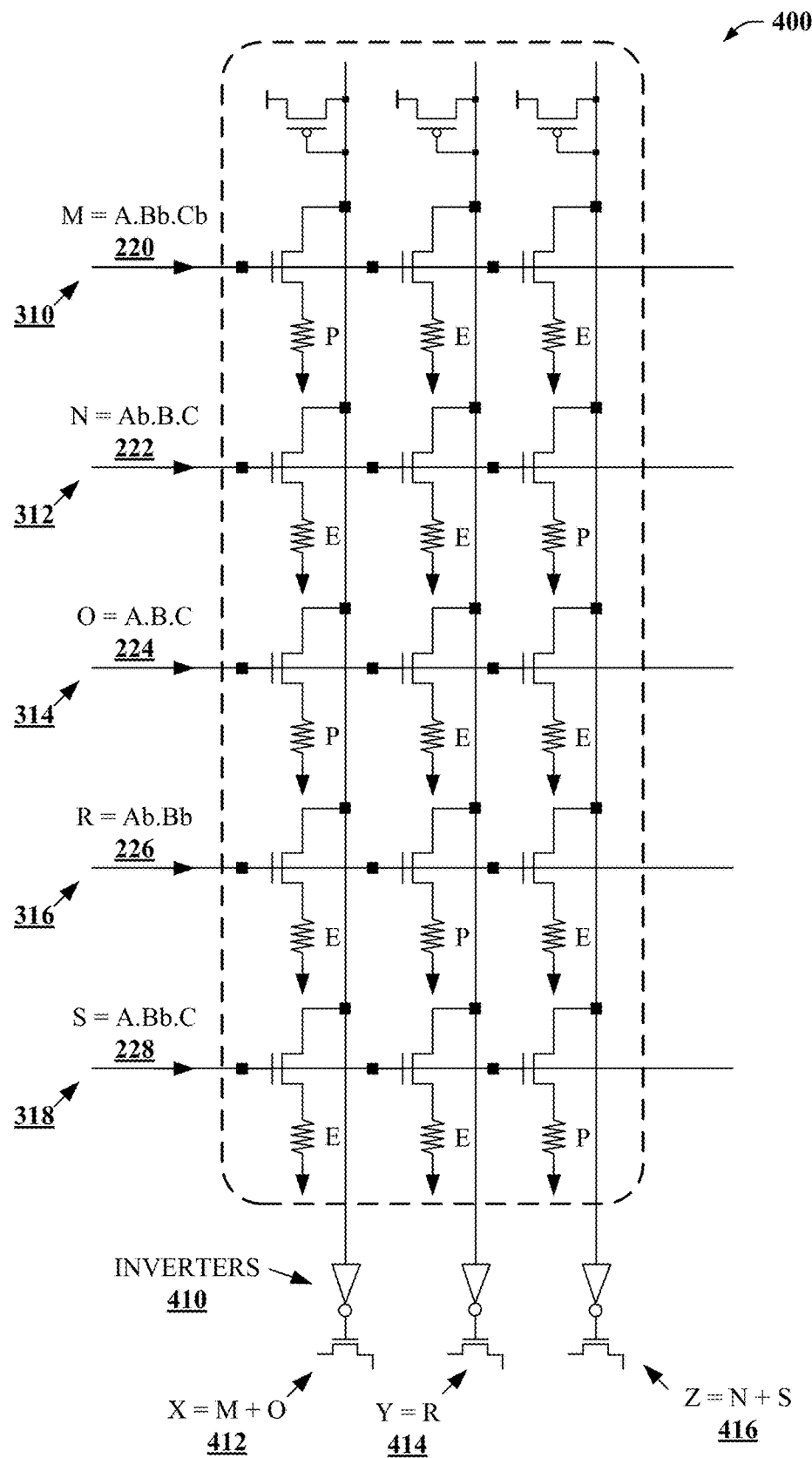
FIG. 4 illustrates a schematic diagram of an alternative programmable port-mapping circuit in further embodiments.

FIG. 4 illustrates a schematic diagram of an example circuit 400 according to alternative embodiments of the present disclosure. Circuit 400 can have input lines 310-318, NOR outputs 322-326, pull-up circuits 330 and sets of memory circuits 340-348 substantially similar to circuit 300 of FIG. 3, supra, in at least some embodiments. Further, circuit 400 can receive output signals 620-628 as inputs, and select a NOR output in response to a set of output signals 620-628, based on programming of the sets of memory circuits 340-348 and values of the set of output signals 620-628. In addition to the foregoing, circuit 400 can further comprise a set of inverters 410 connected to NOR outputs 322-326, providing inverted outputs, including: inverted output X 412, inverted output Y 414 and inverted output Z 416 (referred to collectively as inverted NOR outputs 412-416). The inverted NOR outputs 412-416 generate a high signal (e.g., default voltage generated by pull-up circuits 330) in response to an associated NOR output voltage being pulled down, and is low in response to the associated NOR output voltage maintaining the high voltage. Accordingly, utilizing inverted NOR outputs 412-416, a selected output from circuit 400 is a high signal, utilizing the same programming illustrated by sets of memory circuits 340-348 of FIG. 3.

Figure 5:
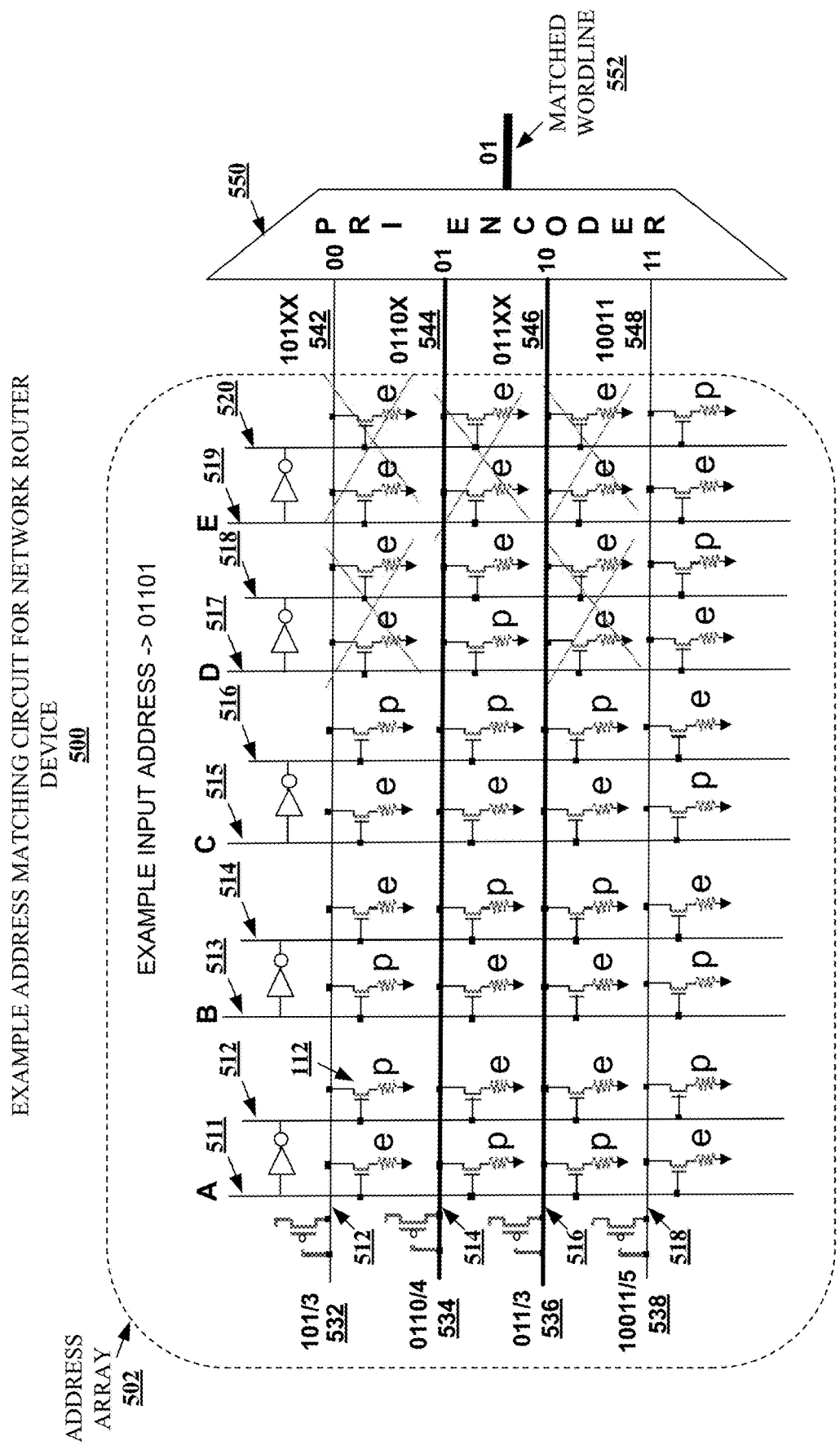
FIG. 5 depicts a schematic diagram of an example programmable address-matching circuit for a network router device in still other embodiments.

FIG. 5 depicts a schematic diagram of an example address matching circuit 500 for a network router device according to alternative or additional embodiments of the present disclosure. Address matching circuit 500 can comprise an address array 502 having input lines, upon which a received address can be entered, and output lines. Respective sets of memory cells 112 on the output lines can be utilized to store saved memory addresses, and a match between the received address and one (or more) of the saved addresses can be indicated by a high output one an associated output line(s), as described herein. To reduce a number of output lines required to store a set of saved addresses, some of the output lines of address array 502 can be programmed to generate the high output for multiple received addresses, and conflicts resulting from multiple positive output lines can be resolved by a priority encoder 550.

As a specific example, address array 502 can comprise input lines A 511, B 513, C 515, D 517 and E 519, with respective inverted inputs A bar (also referred to as Ab) 512, Bb 514, Cb 516, Db 518 and Eb 520 (referred to collectively as input lines 511-520). Further, a set of output lines 512, 514, 516 and 518 (referred to collectively as output lines 512-518) are provided that intersect input lines 511-520. Sets of memory circuits 112 comprising a non-volatile, two-terminal resistive switching memory cell are provided at respective intersections of each input line 511-520 and output line 512-518, as described herein. Memory circuits 112 on a particular output line (e.g., output line 512) are programmed to store a program pattern 532, 534, 536 and 538 (referred to collectively as program patterns 532-538). If a received address at input lines 511-520 does not match an associated program pattern 532-538 at a given output line 512-518, the memory circuits on that output line 512-518 will pull a default voltage on the output line to a low value. If the received address does match the stored address, the default voltage on the output line remains at a high value.

For the address array 502 depicted by FIG. 5, input lines 511-520 support a 5-bit input address and output lines 512-518 have memory circuits that can store up to 5-bit stored addresses. However, the disclosure is not limited to this example, as other sized input addresses, or stored addresses can be accommodated by address array 502 in various disclosed embodiments. Memory circuits 112 on a given output line can be programmed with less than a full set of bits associated with input addresses entered onto input lines 511-520. As a result, an output line so programmed can maintain the high default voltage (e.g., be a match) for more than a single input address. As an illustrative example, output line 512 has a program pattern 532 comprising 3 bits: 101 (which is less than the 5 bit addresses that can be accepted by input lines 511-520). The remaining two bits will not pull the default voltage on output line 512 low, and thus output line 512 will generate an output signal 542 that has a high output for an input address of 101XX, where X indicates any value. Continuing the example of FIG. 5, memory circuits on output line 514 are programmed to 4 stored bits of: 0110 to generate an output signal 0110X 544, output line 516 is programmed to store 3 bits of: 011 to generate an output signal 011XX 546, and output line 518 is programmed to store 5 bits of: 10011 to generate an output signal 10011 548.

An address received on input lines 511-520 will result in a high output signal 542-548 if the received address matches one or more of the program patterns 532-538 associated with an associated output line(s). A priority encoder 550 is provided and can be programmed to resolve conflicts between high output signals 542-548 on multiple output lines 512-518. Thus, for the example input address 01101, both the 4-bit program pattern 534 of 0110 and the 3-bit program pattern 536 of 011 will match this input address. Accordingly, output signal 0110X 544 and output signal 011XX 546 on output lines 514 and 516, respectively, will be high. Priority encoder 550 can be programmed to resolve a conflict between output signal 0110X 544 and output signal 011XX 546, as well as conflicts between other subsets of output signals 542-548. For the example of FIG. 5, priority encoder 550 is programmed to generate a matched output 552 in the event of such a conflict, though other conflict programming is within the scope of the present disclosure.

Figure 5A:
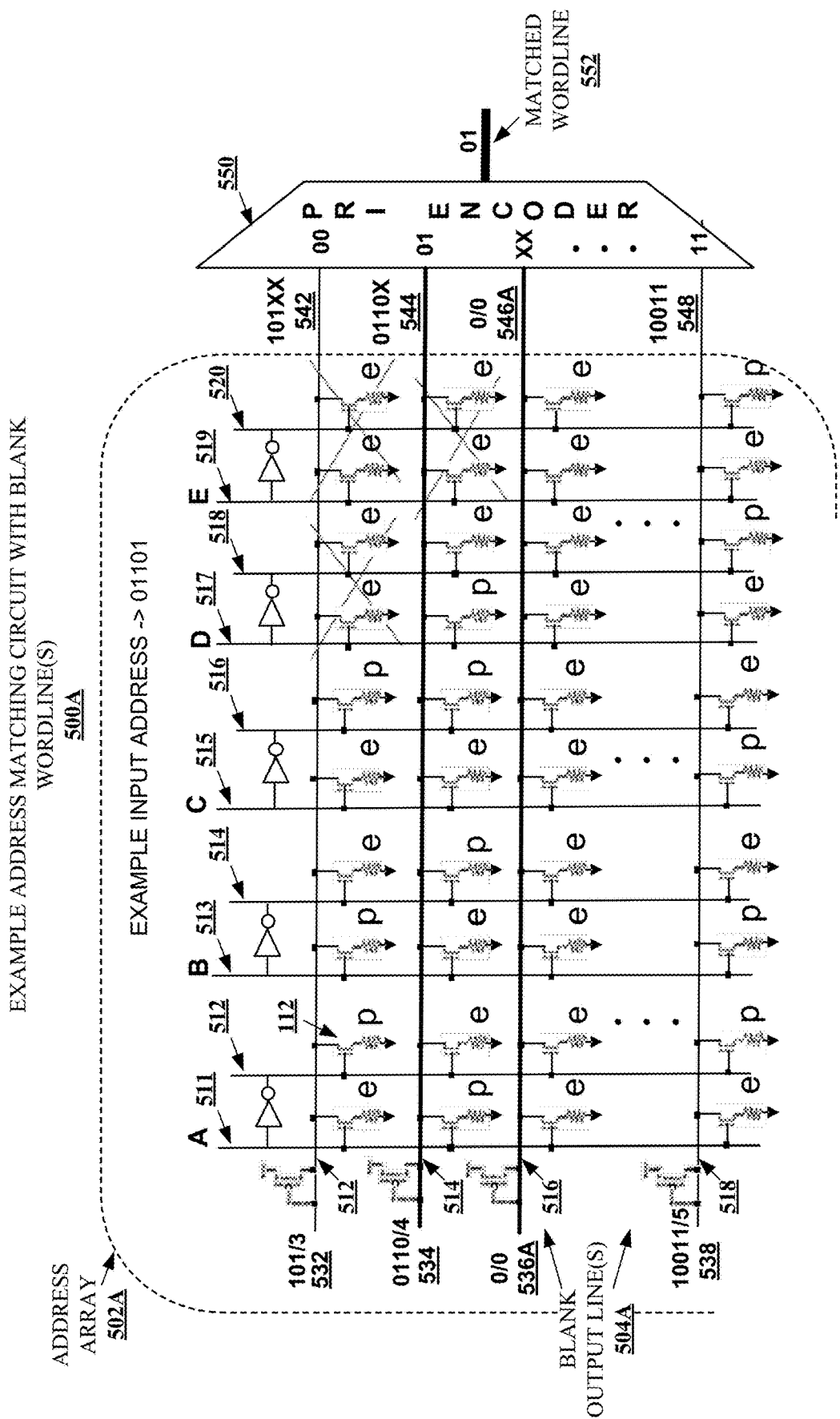
FIG. 5A illustrates a schematic diagram of an example address-matching circuit with blank output lines facilitating updated network address mapping.

FIG. 5A illustrates a schematic diagram of a sample address matching circuit 500A for a network routing device according to alternative embodiments of the present disclosure. Address matching circuit 500A includes an address array 502A having one or more blank output lines 504A, including output line 516, in between programmed output lines 512, 514 and 518. The blank output line(s) 504A can have respective sets of memory circuits 112 that are unprogrammed, and furthermore blank output lines 504A have output signals 546A that are always low, and not part of the conflict resolution programming of priority encoder 550. A new network address(es) received at the network router device (e.g., in conjunction with a program new network address command, or the like) can be programmed to one of blank output lines 504A. As an alternative, e.g., in an event that all output lines are already allocated and there are no blank output lines, one of the already allocated lines may be reprogrammed for the new network address. Moreover, priority encoder 550 can then be updated to resolve conflicts, if any, between an output signal generated by the new network address(es) with existing output signals 542, 544, 548. Significantly, blank output lines 504A enable the new network address to be updated to address array 502A and priority encoder 550 to be updated without displacing existing program patterns 532, 534, 538 at output lines 512, 514 and 518, respectively, and without undermining the existing priority encoding of output lines 542, 544, 548 at priority encoder 550. Thus, address array 502A can be updated with new addresses with minimal if any change to existing address programming at programmed output lines, and priority encoding at priority encoder 550.

Figure 6:
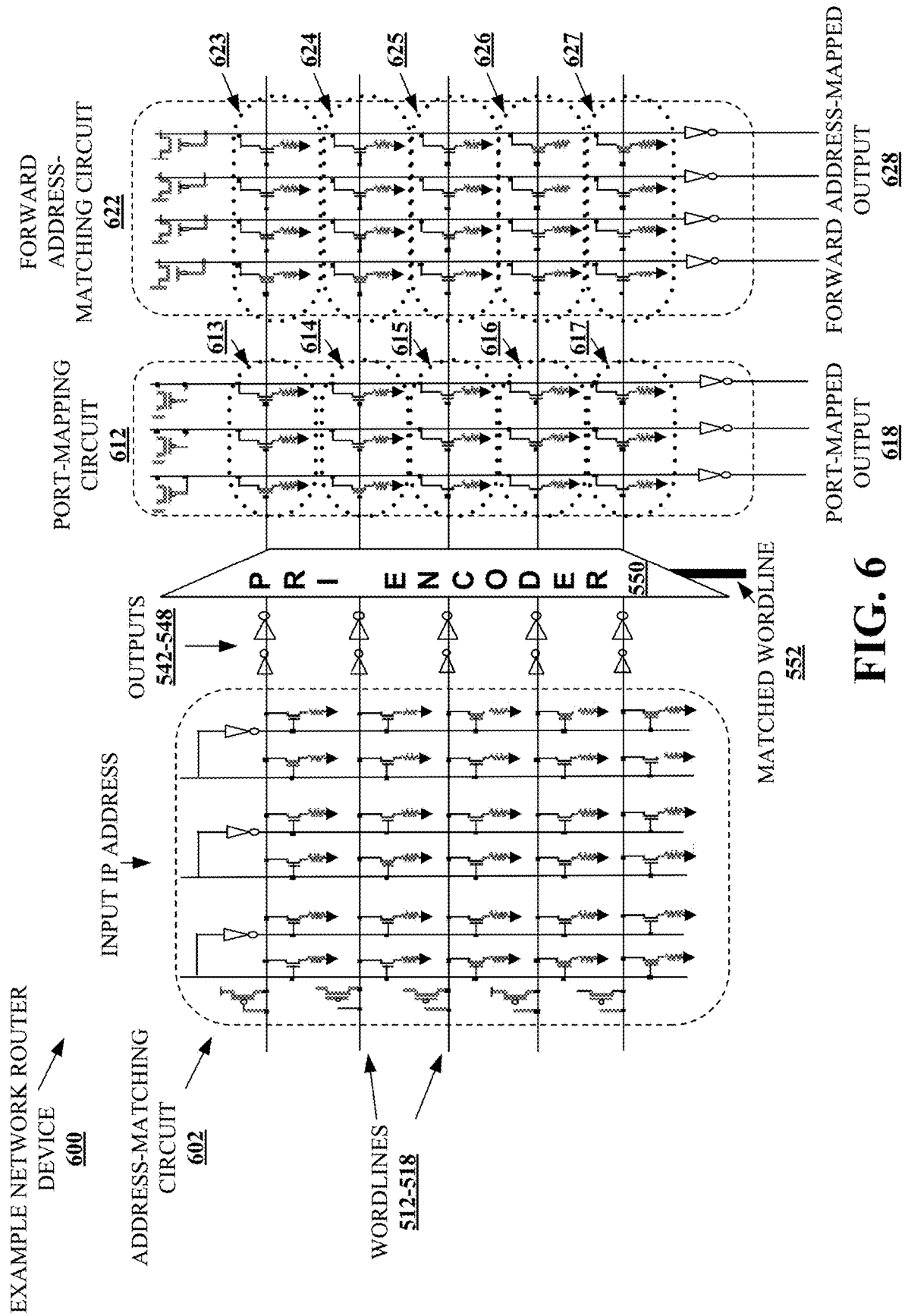
FIG. 6 depicts a schematic diagram of a sample network router device according to various disclosed embodiments.

Addressing matching circuit 500A can be operable in conjunction with additional embodiments of the present disclosure. For instance, in some embodiments, programmed output lines 512, 514 and 518 can be reprogrammed. Reprogramming can occur in response to an overwrite command received at address matching circuit 500A, along with a new address for overwriting and identity of the output line 512-518. In other embodiments, reprogramming can occur in response to an algorithm identifying an existing program pattern 532, 534, 538 to fall below a threshold selection frequency (e.g., is not commonly in use based on frequency of input addresses at input lines 511-520), exceeds a threshold storage time (e.g., has been stored at address matching circuit 500A beyond a threshold time), or the like, or a suitable combination of the foregoing. Reprogramming of programmed output lines 512, 514, 518 can be functionality of address matching circuit 500A in addition to maintenance of blank output line(s) 504A, as des FIG. 6 illustrates a schematic diagram of an example network router device 600 according to further embodiments of the present disclosure. As described below, network router device 600 can receive a data packet having a target network address, and utilizing the received target network address network router device 600 can identify a downstream port for transmitting the data packet to (or one hop closer toward) the target network address. In an embodiment, network router device 600 can further identify a forwarding address associated with the target network address, if any.

Network router device 600 can comprise an address-matching circuit 602, a priority encoder 550, a port-mapping circuit 612 and a forward address-mapping circuit 622, in one or more embodiments. As an example, address-matching circuit 602 can comprise address array 502 of FIG. 5 or address array 502A of FIG. 5A, supra. In an alternative embodiment, address-matching circuit 602 can comprise programmable logic circuit 100 of FIG. 1, or circuit 200 of FIG. 2, or other suitable address-matching circuit in various alternative embodiments (In such alternative embodiments, priority encoder 550 can be removed in the event that full addresses are mapped to the address-matching circuit). As a further example, port-mapping circuit 612 or forward address-mapping circuit 622 can utilize circuit 300 of FIG. 3, or circuit 400 of FIG. 4, in various embodiments, or another suitable circuit with similar functionality as provided above. The subject disclosure is not limited to these embodiments, however, and other circuits known in the art or made known to one of skill in the art by way of the context provided herein are considered within the scope of the present disclosure.

A target network address can be extracted from a received data packet by network router device 600 and entered into address-matching circuit 602 as an input network address (e.g., Internet Protocol (IP) address, although the subject disclosure is not limited to an IP address). A matching output (e.g., a default voltage, as one example) will be present on one or more of wordlines 512-518 that match the input network address. The matching output is generated at signal outputs 542-548, and entered to priority encoder 550, which generates a matched wordline output 552. Though matched wordline output 552 is depicted as a separate output provided from priority encoder 550, the matched wordline output 552 is (also) present on one of wordlines 512-518 based on priority programming of priority encoder 550. Accordingly, the matched wordline output 522 is provided as an input to port-mapping circuit 612 and forward address-mapping circuit 622. Thus, matched wordline output 552 also refers to the matched output generated by priority encoder 550 on one of wordlines 512-518 that is provided to subsequent circuitry (e.g., port-mapping circuit 612 and address-forwarding circuit 622, in the example network router device 600 of FIG. 6).

The matched wordline output 552 is received at port-mapping circuit 612. Port-mapping circuit 612 comprises a set of memory circuits, including memory circuits 613, 614, 615, 616, and 617 (referred to collectively as sets of memory circuits 613-617), for each of wordlines 512-518. One of the sets of memory circuits 613-617 on the same wordline 512-518 as the associated matched wordline output 552 will be activated by matched wordline output 552. Based on programming of the activated set of memory circuits 613-617, a downstream port line will be activated, identifying a downstream port associated with the input network address as a port-mapped output 618, as described herein (e.g., see FIGS. 3 and 4, supra). Additionally, the matched wordline output 552 is received at forward address-mapping circuit 622, which comprises a second set of memory circuits, including memory circuits 623, 624, 625, 626 and 627 (referred to collectively as second set of memory circuits 623-627), for each of wordlines 512-518. Accordingly, one of the second sets of memory circuits 623-627 will be activated by matched wordline output 552 as well. Based on programming of the activated second set of memory circuits 623-627, a forward address line (e.g., one of the vertical bitlines of forward address-matching circuit 622) will be activated providing a forward address-mapped output 628 that can be mapped to a forwarding address for the input network address. Where no forwarding address is mapped to the input network address, an associated one of second memory circuits 623-627 can be left unprogrammed, such that no activated forward address line is produced by forward address-mapping circuit 622 in response to matched wordline output 552.

Based on the foregoing, a target address input at address-matching circuit 602 can generate a port-mapped output 618 identifying a downstream port for transmission of a data packet associated with the target address, and optionally a forwarding address for transmission of the data packet (if a forwarding address is programmed at forward address-mapped circuit 622 on the same wordline 512-518 that the network address is programmed at address-matching circuit 602). The downstream port and forwarding address can be identified fairly rapidly (e.g., in a few tens of nanoseconds or less, depending on response speed of address-matching circuit 602, priority encoder 550 and the port-mapping and forward address-mapping circuits 612, 622) and with relatively low power consumption compared to conventional network router devices that employ a DRAM memory lookup for each received network address, as one example. Additionally, network router device 600 can utilize fewer wordlines 512-518 for a given set of mapped network addresses, by having multiple addresses programmed to a given wordline, and priority encoder 550 resolving conflicts. Accordingly, array dimensions of address-matching circuit 602 can be reduced for network router device 600.

Figure 7:
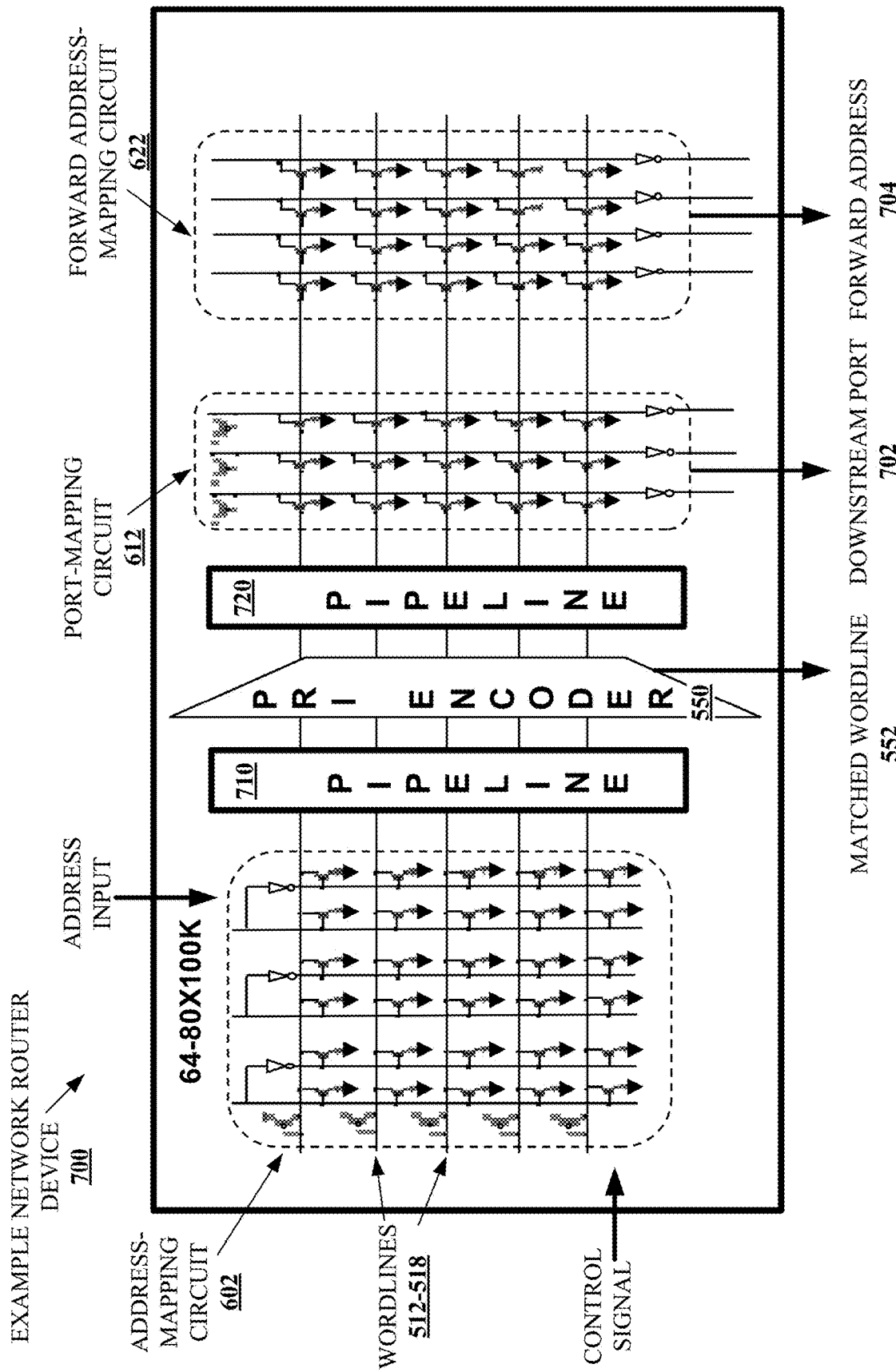
FIG. 7 illustrates a schematic diagram of an example network router device according to alternative or additional embodiments.

FIG. 7 illustrates a schematic diagram of an example network router device 700 according to still other embodiments of the present disclosure. Network router device 700 can comprise an address-matching circuit 602, priority encoder 550, port-mapping circuit 612 and forward address-mapping circuit 622 substantially as described herein (e.g., see FIG. 6, supra). Additionally, network router device 700 can comprise a first pipeline circuit 710 positioned between address-matching circuit 602 and priority encoder 550, and a second pipeline circuit 720 positioned between priority encoder 550 and port-mapping circuit 612 and forward address-mapping circuit 622, as illustrated. Wordlines 512-518 exiting address-matching circuit 602 are entered at an input of first pipeline circuit 710, which can store values of output signals generated by address-matching circuit 602 on the wordlines 512-518. First pipeline circuit 710 can then provide these output signals as inputs to priority encoder 550. Output lines from priority encoder 550 (corresponding to wordlines 512-518), including matched wordline output 522 described above, are input to second pipeline circuit 720, which stores the matched wordline output 522. Second pipeline circuit 720 includes additional output lines that provide the matched wordline output 522 as an input to port-mapping circuit 612 and forward address-mapping circuit 622 to identify a downstream port 702 and forward address 704 in response to the matched wordline output 522, as described herein.

First pipeline circuit 710 and second pipeline circuit 720 facilitate independent staging of different circuits of network router device 700. In various embodiments, first pipeline circuit 710 and second pipeline circuit 720 can comprise a suitable array of latching circuits (e.g., a data latch array, a flip-flop array, a shift register array, etc.), or the like. In effect, the pipeline circuits can increase bandwidth of network router device 700 with well-designed staging of independent circuits of network router device 700. In one or more embodiments, address-mapping circuit 602, port-mapping circuit 612 or forward address-mapping circuit 622 can have one or more blank program lines (e.g., see FIG. 5A, blank output lines 504A) to facilitate addition of new network addresses, or new network address/downstream port associations or new network address/forwarding address associations. In the case of address-mapping circuit 602, an integer number: n of blank lines can be interspaced between subsets of a second integer number: x of programmed lines, to limit a number of existing programmed lines that need to be adjusted to accommodate a new address within a given subset of programmed lines and a new priority encoding.

As an example of operation, address-mapping circuit 602 can operate on a first address (in a first stage), while priority encoder generates a matched wordline output 522 from a second (previous) address (in a second stage), while port-mapping circuit 612 and forward-address mapping circuit 622 identify a downstream port 702 and a forward address 704 for a third (twice previous) address (in a third stage). Described differently, first pipeline circuit 710 and second pipeline circuit 720 facilitate concurrent operations by address-mapping circuit 602, priority encoder 550, and port-mapping circuit 612 and forward address-mapping circuit 622, where operations for each stage pertain to a different input address. By operating concurrently, an average response time (to generate a downstream port 702 or forward address 704 in response to a given input address) of network router device 700 can be reduced. For instance, instead of an average response time equaling a sum of the response times of all three stages (e.g., a first response time of address-mapping circuit 602+a second response time of priority encoder 550+a third response time of port-mapping circuit 612 and forward address mapping circuit 612), the average response time can be no more than the slowest individual stage of network router device 700. As a more specific example, if the response time of all three stages is 10 nanoseconds respectively, then average response time of network router device is 10 nanoseconds due to independent pipelining provided by first pipeline circuit 710 and second pipeline circuit 720, rather than a combined 30 nanoseconds.

Figure 8:
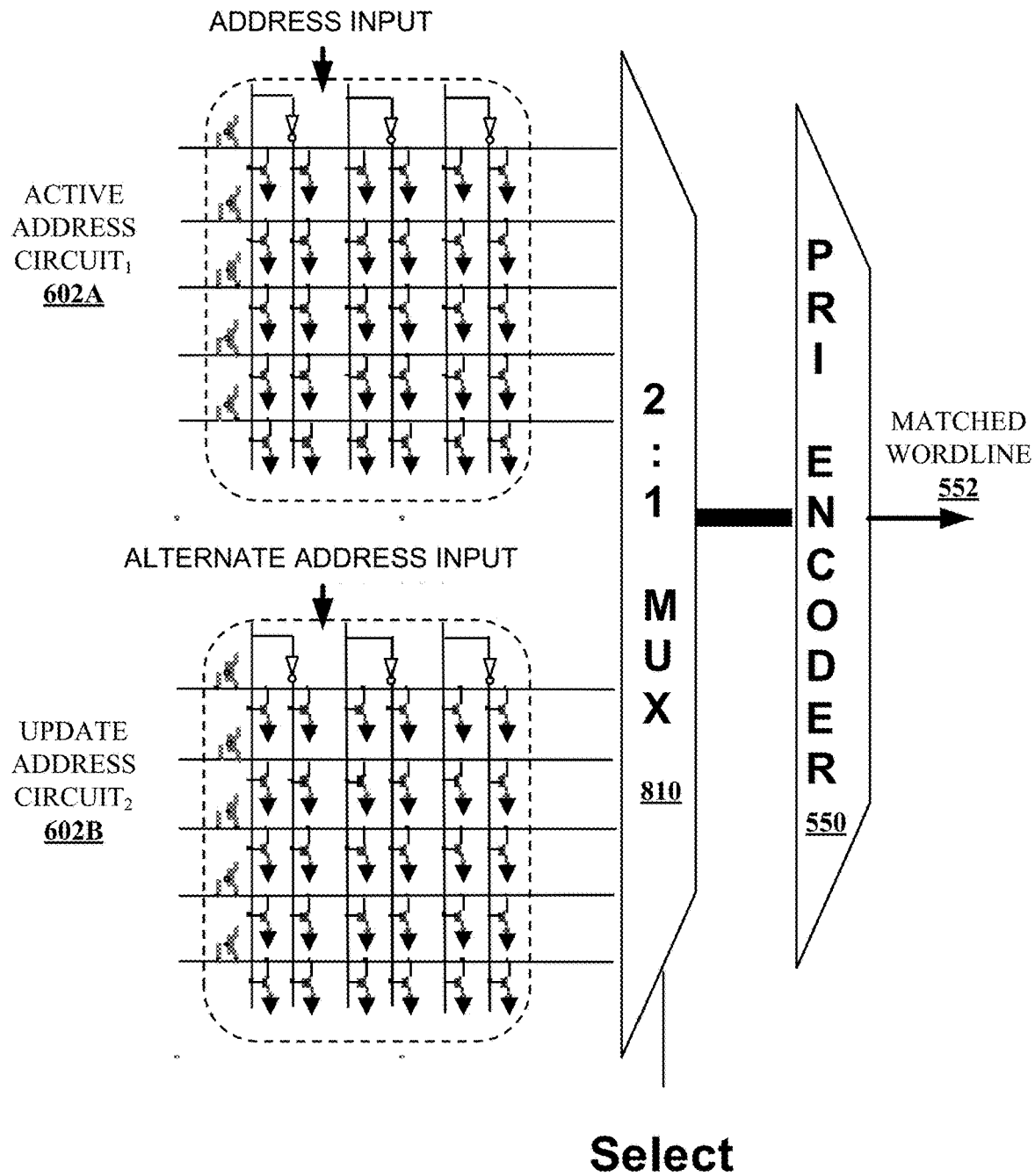
FIG. 8 depicts a schematic diagram of a sample network router device according to other embodiments.

FIG. 8 depicts a schematic diagram of an example network router device 800 according to alternative or additional embodiments of the present disclosure. Network router device 800 can comprise multiple address-matching circuits, including an active address-matching circuit 602A and an update address-matching circuit 602B. Data packets received at network router device 800 are processed by active address-matching circuit 602A in general. When a new network address to be programmed to network router device 800 is received, instead of stopping the processing of the data packets to program the new network address, data packet processing can continue on active address-matching circuit 602A, while update address-circuit 602B is reprogrammed to include the existing network address programming of active address circuit 602A, plus the new network address, resulting in an updated network address programming. Further, new priority encoding can be generated for the updated network address programming, to be stored at priority encoder 550. Once the updated network address programming is completed at update address circuit 602B, network router device 800 can program the new priority encoding at priority encoder 550, and can switch the data packet processing from active address-matching circuit 602A to update address-matching circuit 602B. A 2 to 1 multiplexer 810 (or N to 1 multiplexer, in the event of N address-matching circuits) can be provided to route the output from update address-matching circuit 602B as well as from active address-matching circuit 602A to priority encoder 552. Accordingly, priority encoder 552 is not affected by the change in data packet processing from active address-matching circuit 602A to update address-matching circuit 602B.

While data packet processing is conducted by update address-matching circuit 602B, the updated network address programming can then be programmed to active address matching circuit 602A. Accordingly, network router device 800 can maintain data packet processing while the active address-matching circuit 602A is being updated to reflect a new set of network address. This can mitigate or avoid downtime associated with changing the network address programming of active address-matching circuit 602A. Once fully updated to reflect the updated network address programming, data packet processing can be switched back to active address-matching circuit 602A, and update address-matching circuit 602B can be idle until a further change to the network address programming of network router device 800 is received.

Figure 9:
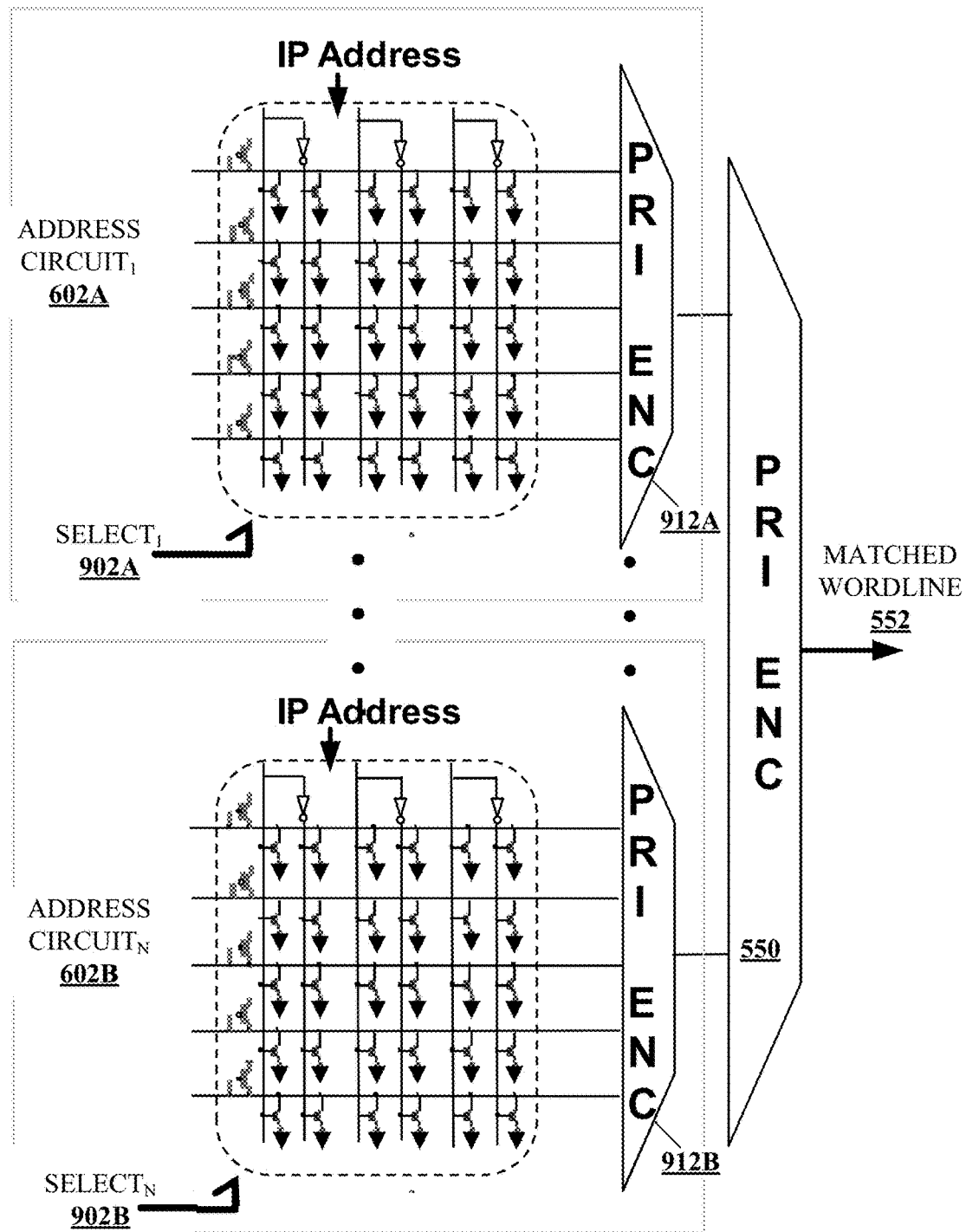
FIG. 9 illustrates a schematic diagram of an example network router device in yet another embodiment(s)

FIG. 9 depicts a schematic diagram of a sample network router device 900 according to still other embodiments of the present disclosure. Network router device 900 can comprise multiple address-matching circuits, including a first address-matching circuit 602A (circuit$_1$ 602A) through an Nth address-matching circuit 602B (circuit$_N$ 602B), where N is a suitable positive integer greater than 1 (referred to collectively as address-matching circuits 602A-602B). A set of network addresses stored by network router device 900 can be shared among the respective address-matching circuits 602A-602B. For instance, a first subset of the stored network addresses can be saved to first address matching circuit 602A and a second subset of the stored network addresses can be saved to the Nth address matching circuit 602B. As discussed above at FIG. 5, supra, programmed addresses can include only a portion of the bits of a single address, such that multiple input addresses could correspond to a given output line of one of address-matching circuits 602A-602B, and further an input address could be matched on multiple address-matching circuits 602A-602B. Separate priority encoders 912A, 912B are programmed for each address-matching circuit 602A, 602B to resolve conflicts among output lines within a given address-matching circuit 602A, 602B, and a system priority encoder 550 is programmed to resolve conflicts among multiple address-matching circuits 602A-602B.

In operation, each address-matching circuit 602A-602B can be initialized, and can have separate control circuitry in some embodiments, or share common control circuitry in other embodiments. A received address is input into each of arrays 602A-602B and the arrays 602A-602B can perform lookup operations (e.g., address-matching) in parallel on the received address. Output of system priority encoder 552 is indicative of an address match, and can be provided to a port-mapping circuit or forward address-mapping circuit as described herein. If control circuitry is shared, a select signal can select an array to update a subset of network addresses saved to the array. Where arrays have respective control circuitry, the arrays can be updated in parallel by separate select signals. In at least one embodiment, one or more sets of unprogrammed output lines (e.g., see blank output lines 504 of FIG. 5A) can be situated among groups of programmed output lines within each of address-matching arrays 602A-602B, to facilitate updating the subsets of network addresses stored at the address-matching arrays 602A-602B while reducing the reprogramming needed to update the respective arrays.

Figure 10:
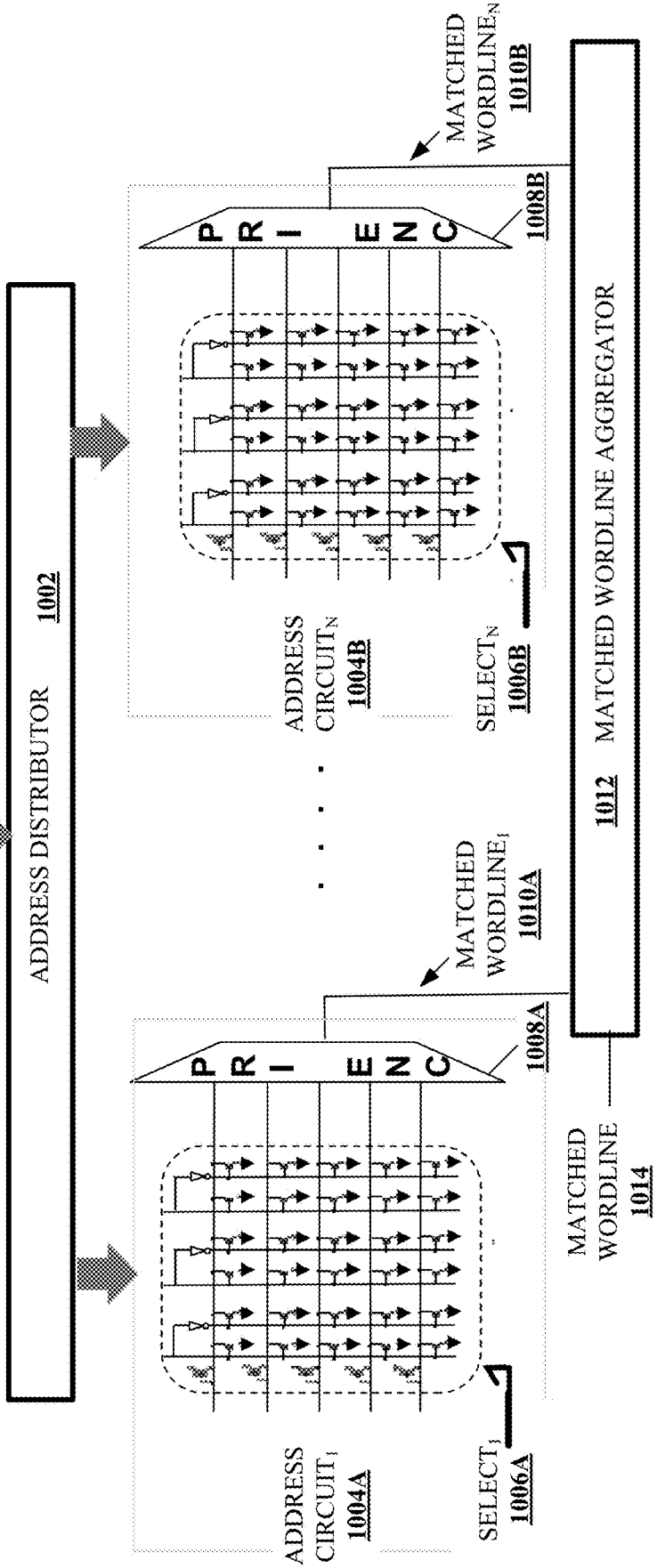
FIG. 10 depicts a schematic diagram of a sample network router device according to still further embodiments.

FIG. 10 illustrates a schematic diagram of a sample network router device 1000 according to additional embodiments of the present disclosure. Network router device 1000 can comprise an address distributor 1002, and multiple address-matching circuits including a first address-matching circuit 1004A (or circuit 1004A) through an Nth address-matching circuit 1004B (or circuit 1004B), referred to collectively as address-matching circuits 1004A-1004B. In the embodiment of FIG. 10, each of address-matching circuits 1004A-1004B stores the same set of network addresses. Address distributor 1002 routes received network addresses to respective address-matching circuits 1004A-1004B, enabling address lookups for different network addresses to be implemented in parallel by the address-matching circuits 1004A-1004B. Respective priority encoders 1008A, 1008B resolve output line conflicts among the address-matching circuits 1004A-1004B, and generate respective matched wordline outputs 1010A through 1010B. The matched wordline outputs 1010A, 1010B are provided to a matched wordline aggregator 1012 that generates a single matched wordline output 1014 in response to each input address provided to address distributor 1002. By operating multiple address-matching circuits 1004A-1004B in parallel, address-matching throughput of network router device 700 can be increased. In various embodiments, port-mapping circuit 612 can be implemented with multiple parallel arrays similar to address-matching circuits 1004A-1004B to implement parallel downstream port-matching, or forward address-mapping circuit 622 can be implemented with multiple parallel arrays similar to address-matching circuits 1004A-1004B to implement parallel forward address-matching, or a suitable combination of the foregoing.

The aforementioned diagrams have been described with respect to interaction between several components of an electronic device, an input, an output, a memory circuit, or memory architecture. It should be appreciated that in some suitable alternative aspects of the subject disclosure, such diagrams can include those components, inputs, outputs, architectures, etc., specified therein, some of the specified components/inputs/outputs/architectures, or additional components/inputs/outputs/architectures. Sub-components can also be implemented as connected to other sub-components rather than included within a parent component. For example, multiple memory banks can be provided on separate memory chips, instead of on a single chip. Additionally, it is noted that one or more disclosed processes can be combined into a single process providing aggregate functionality. Components of the disclosed devices/architectures can also interact with one or more other components not specifically described herein but known by those of skill in the art.

In view of the exemplary diagrams described supra, process methods that can be implemented in accordance with the disclosed subject matter will be better appreciated with reference to the flow charts of FIGS. 11-14. While for purposes of simplicity of explanation, the methods of FIGS. 11-14 are shown and described as a series of blocks, it is to be understood and appreciated that the claimed subject matter is not limited by the order of the blocks, as some blocks may occur in different orders or concurrently with other blocks from what is depicted and described herein. Moreover, not all illustrated blocks are necessarily required to implement the methods described herein. Additionally, it should be further appreciated that some or all of the methods disclosed throughout this specification are capable of being stored on an article of manufacture to facilitate transporting and transferring such methodologies to an electronic device. The term article of manufacture, as used, is intended to encompass a computer program accessible from any computer-readable device, device in conjunction with a carrier, or storage medium.

Figure 11:
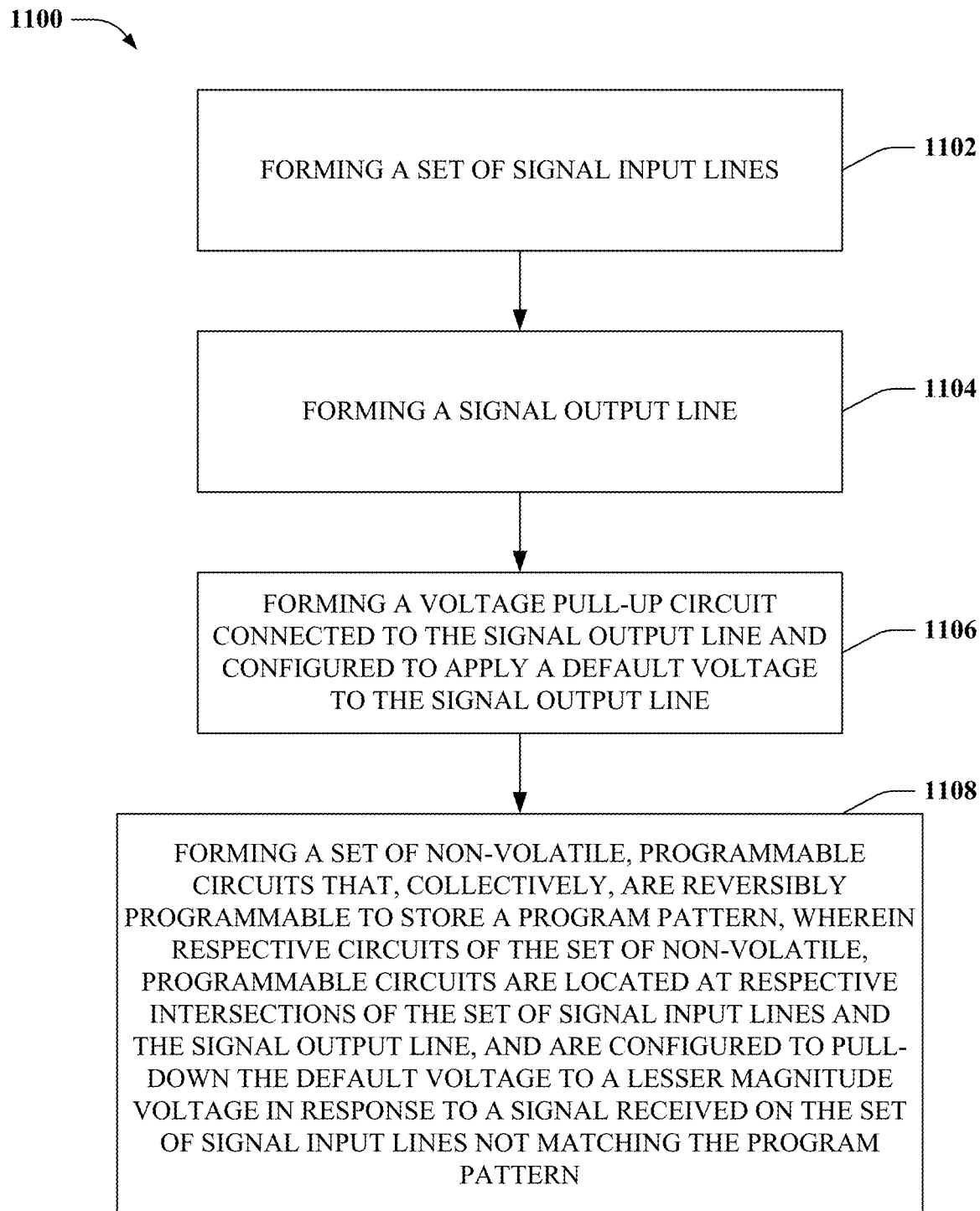
FIG. 11 illustrates a flowchart of a sample method for fabricating a programmable circuit according to one or more disclosed embodiments.

FIG. 11 depicts a flowchart of a sample method 1100 for fabricating an electronic circuit, according to one or more further embodiments of the present disclosure. At 1102, method 1100 can comprise forming a set of signal input lines, and at 1104, forming a signal output line. In various embodiments, method 1100 can comprise forming a plurality of signal output lines, including the signal output line. Additionally, at 1106, method 1100 can comprise forming a voltage pull-up circuit connected to the signal output line and configured to apply a default voltage to the signal output line. At 1108, method 1100 can further comprise forming a set of non-volatile, programmable circuits that, collectively, are reversibly programmable to store a program pattern. In one or more embodiments, respective circuits of the set of non-volatile, programmable circuits can be located at respective intersections of the set of signal input lines and the signal output line, and can be configured to pull-down the default voltage to a lesser magnitude voltage in response to a signal received on the set of signal input lines not matching the program pattern.

In further embodiments of method 1100, forming the set of non-volatile, programmable circuits can further comprise forming a two-terminal resistance-switching memory device having a first terminal connected to a first of the set of signal input lines, and a second terminal connected to the signal output line. In yet another embodiment of method 1100, forming the set of non-volatile, programmable circuits can further comprise forming a transistor comprising a gate, a source and a drain, connecting the gate to a first of the set of signal input lines, and connecting the source to the signal output line. Additionally, method 1100 can comprise forming a two-terminal resistance-switching memory device having a first terminal and a second terminal, and connecting the first terminal to the drain and connecting the second terminal to the ground.

In further embodiments, method 1100 can comprise forming a distribution circuit and connecting the signal output line to an input of the distribution circuit. In one or more additional embodiments, forming the distribution circuit can further comprise forming a set of distribution circuit output lines, and associating respective ones of the set of distribution circuit output lines with a downstream transmission node of a router device. Forming the distribution circuit can additionally comprise forming a second set of non-volatile, programmable circuits configured to select one of the set of distribution circuit output lines for the signal output line, in response to receiving the default voltage from the signal output line at the input of the distribution circuit, in an embodiment. Moreover, forming the second set of non-volatile programmable circuits can further comprise forming a transistor comprising a gate, a source and a drain, connecting the gate to the input of the distribution circuit, connecting the source to a first of the set of distribution circuit output lines, forming a two-terminal resistance-switching memory device having a first terminal and a second terminal, connecting the first terminal to the drain and connecting the second terminal to ground. In further embodiments, method 900 can comprise forming a distribution circuit pull-up device connected to and configured to apply a second default voltage to the first of the set of distribution circuit output lines. In an embodiment, the transistor and the two-terminal resistance-switching memory device can be configured to reduce the second default voltage on the first of the set of distribution circuit output lines, in response to the input of the distribution circuit equaling the default voltage, and in response to the two-terminal resistance-switching memory device being programmed to a low resistance state.

Figure 12:
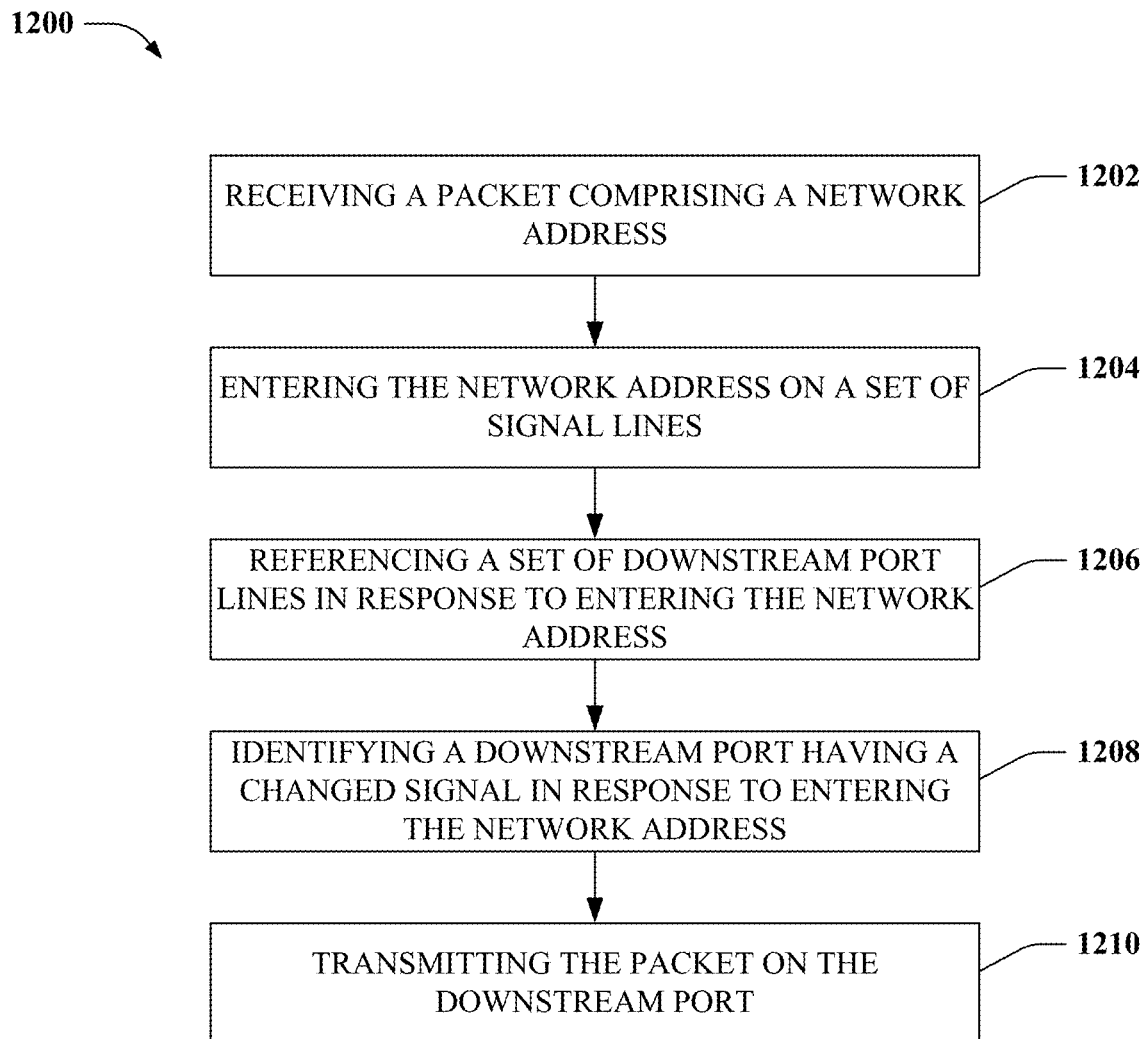
FIG. 12 illustrates a flowchart of an example method for operating a router device utilizing a programmable logic circuit, in further embodiments.

FIG. 12 depicts a flowchart of a sample method 1200 for operating a network routing device, in an embodiment. At 1202, method 1200 can comprise receiving a packet comprising a network address. At 1204, method 1200 can comprise entering the network address on a set of signal lines. The signal lines can be inputs into a logical AND circuit comprising programmable non-volatile resistance-switching memory storage circuits, in an embodiment. At 1206, method 1200 can comprise referencing a set of downstream port lines in response to entering the network address. In an embodiment, the downstream port lines can be output lines of a logical NOR circuit comprising programmable non-volatile resistance-switching memory storage circuits. At 1208, method 1200 can comprise identifying a downstream port line having a changed signal in response to entering the network address. At 1210, method 1200 can comprise transmitting the packet on the identified downstream port.

Figure 13:
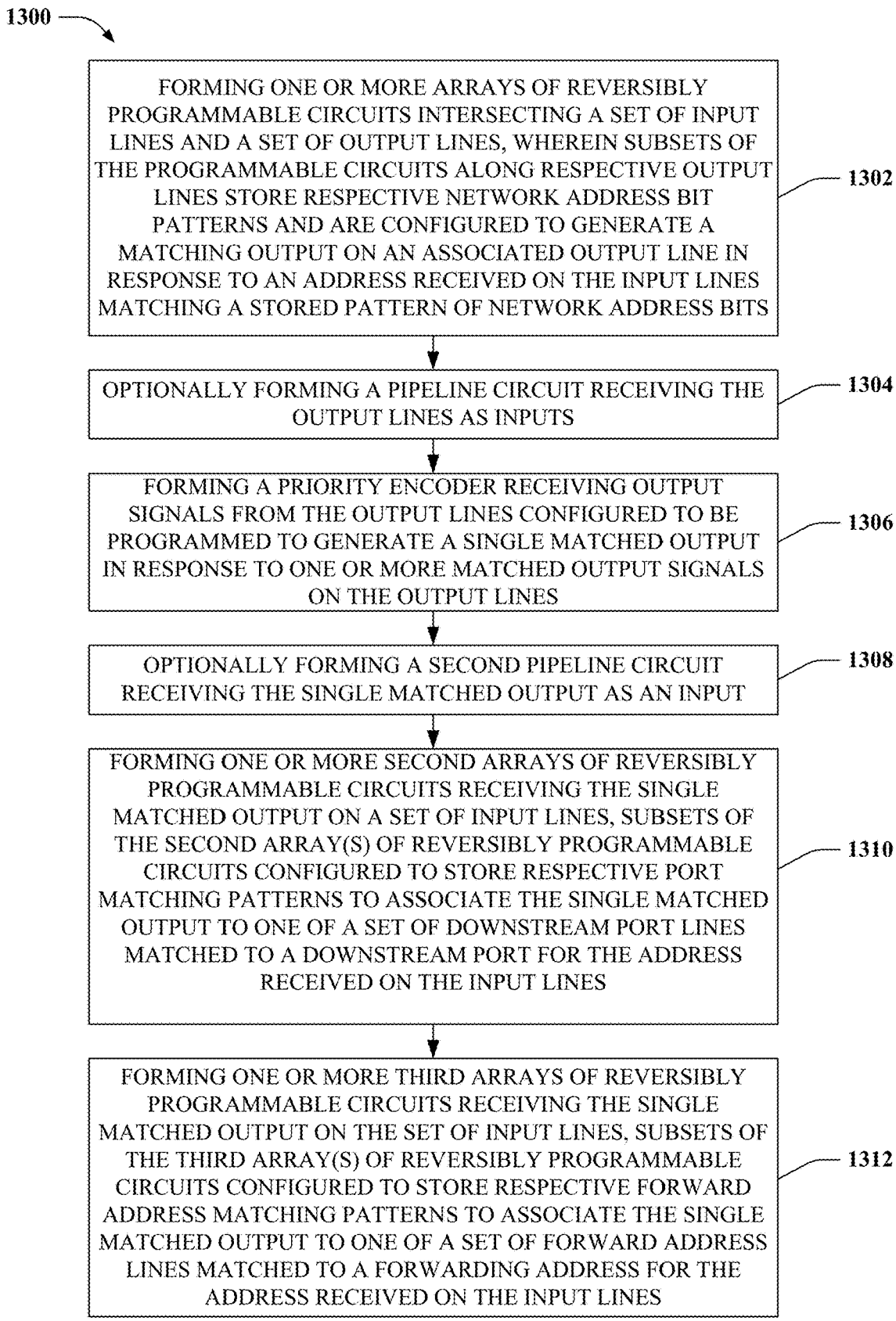
FIG. 13 depicts a flowchart of a sample method for fabricating network router device circuitry in an embodiment.

FIG. 13 illustrates a flowchart of a sample method 1300 for fabricating circuitry for a network router device, in one or more embodiments. At 1302, method 1300 can comprise forming one or more arrays of reversibly programmable circuits intersecting a set of input lines and a set of output lines, wherein subsets of the programmable circuits along respective output lines store respective network address bit patterns and are configured to generate a matching output on an associated output line in response to an address received on the input lines matching a stored pattern of network address bits. In an embodiment, the reversibly programmable circuits can comprise a transistor—having a first contact a second contact and a control gate—in electrical series with a two-terminal resistive switching memory cell having a first terminal and a second terminal, in which the first contact is connected to one of the output lines, the control gate is connected to one of the input lines, the second contact is connected to the first terminal of the two-terminal resistive switching memory cell, and the second terminal is connected to ground.

At 1304, method 1300 can comprise optionally forming a pipeline circuit receiving the output lines as inputs. In various embodiments, the pipeline circuit can comprise a latching circuit, a flip-flop circuit, a shift register circuit, or the like. At 1306, method 1300 can comprise forming a priority encoder that receives output signals from the output lines, wherein the priority encoder is configured to be programmed to generate a single matched output in response to one or more matched output signals on the output lines. At 1306, method 1300 can optionally comprise forming a second pipeline circuit receiving the single matched output as an input.

At 1308, method 1300 can comprise one or more second arrays of reversibly programmable circuits receiving the single matched output on a set of second array input lines, wherein subsets of the second array(s) of reversibly programmable circuits are configured to store respective port matching patterns to associate the single matched output to one of a set of downstream port lines matched to a downstream port for the address received on the input lines. Additionally, at 1310, method 1300 can comprise forming one or more third arrays of reversibly programmable circuits receiving the single matched output on the set of second array input lines, wherein subsets of the third array(s) of reversibly programmable circuits are configured to store respective forward address matching patterns to associate the single matched output to one of a set of forward address lines matched to a forwarding address for the address received on the input lines.

Figure 14:
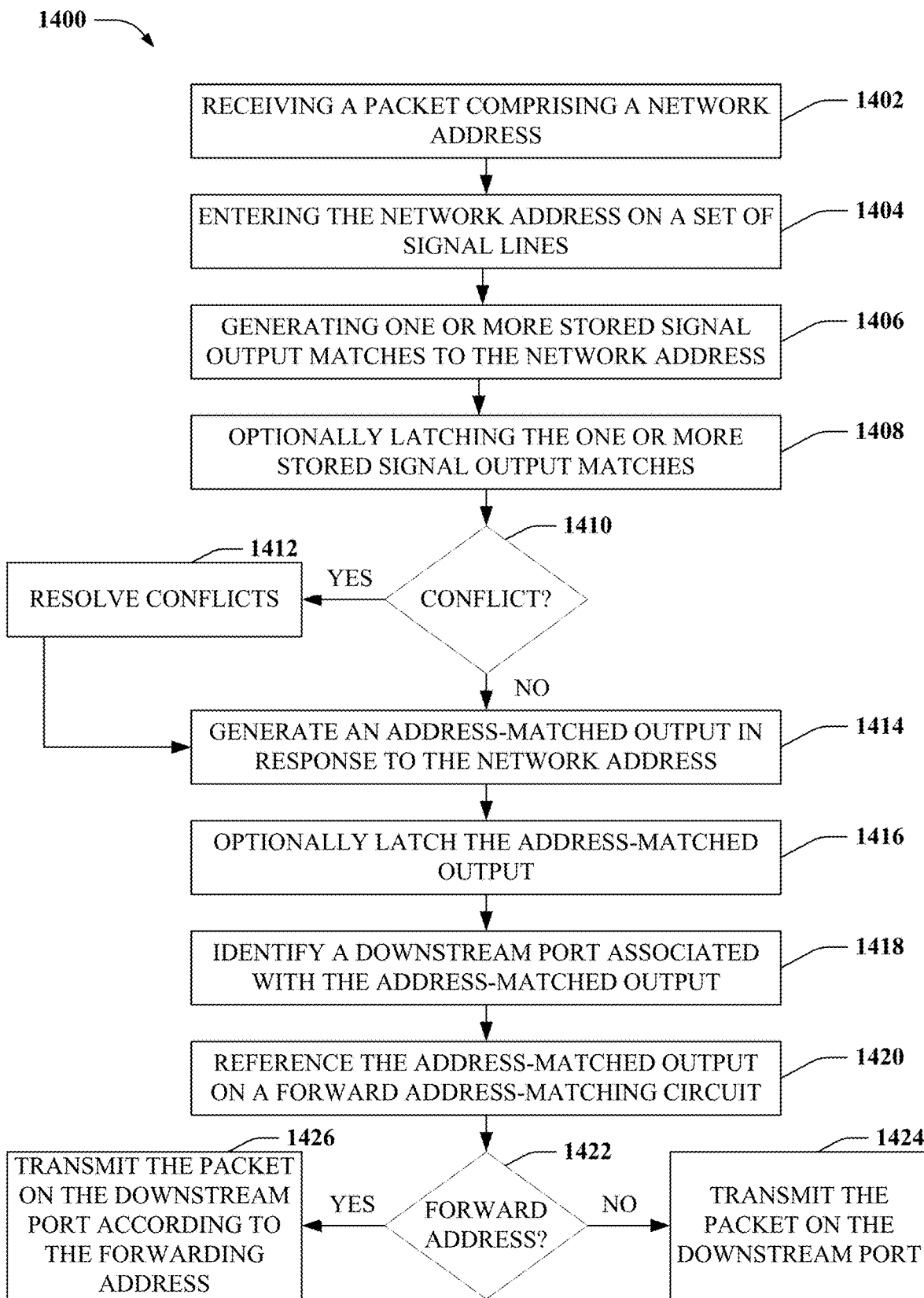
FIG. 14 illustrates a flowchart of a sample method for operating a disclosed network router device in further embodiments.

FIG. 14 depicts a flowchart of a sample method 1400 for operating a network router device, in one or more additional embodiments of the present disclosure. At 1402, method 1400 can comprise receiving a packet comprising a network address. At 1404, method 1400 can comprise entering the network address on a set of signal input lines for an address-matching circuit. At 1406, method 1400 can comprise generating one or more stored signal outputs that match the network address. At 1408, method 1400 can comprise optionally latching the one or more stored signal outputs. At 1410, a determination is made as to whether multiple stored signal outputs are generated. If so, method 1400 can proceed to 1412 and employ a priority encoding to resolve conflict among the multiple stored signal outputs, and proceed to reference number 1414. If multiple stored signal outputs are not generated at reference number 1408, method 1400 proceeds to 1414 and generates an address-matched output in response to the network address. At 1416, method 1400 can optionally latch the address-matched output. At 1418, method 1400 can comprise identifying a downstream port associated with the address-matched output. At 1420, method 1400 can determine whether a forwarding address is associated with the address-matched output. If no forwarding address, method 1400 can proceed to 1424 and can comprise transmitting the packet on the downstream port identified with the address-matched output. If a forwarding address is identified, method 1400 can proceed to 1426 and identify the forwarding address associated with the address-matched output and transmit the packet on the downstream port according to the forwarding address.

Figure 15:
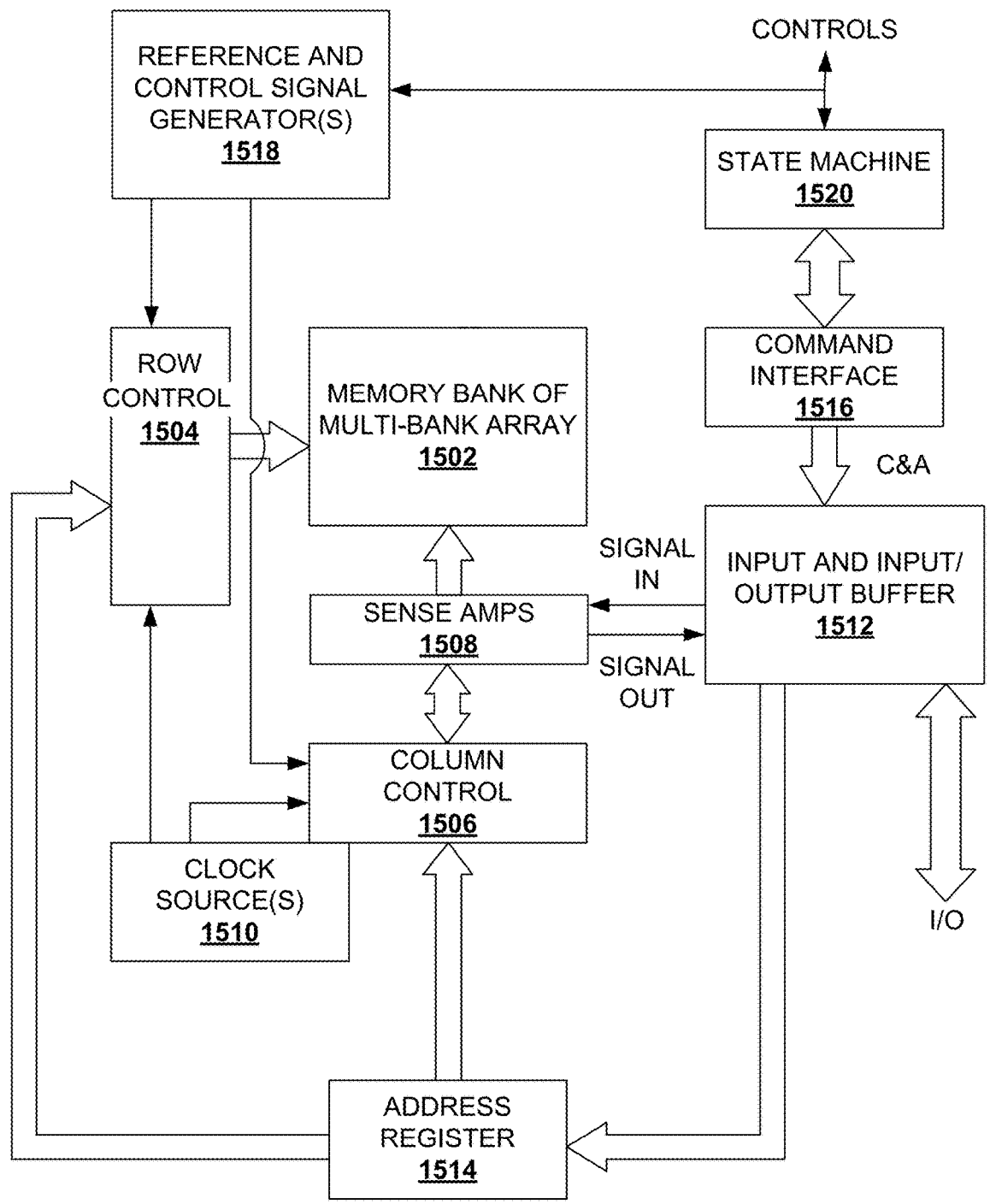
FIG. 15 depicts a block diagram of a sample operating environment for facilitating implementation of one or more aspects disclosed herein.

In order to provide a context for the various aspects of the disclosed subject matter, FIG. 15, as well as the following discussion, is intended to provide a brief, general description of a suitable environment in which various aspects of the disclosed subject matter can be implemented or processed. While the subject matter has been described above in the general context of electronic memory or architectures and process methodologies for operating such memory or architectures, those skilled in the art will recognize that the subject disclosure also can be implemented in combination with other architectures or process methodologies. Moreover, those skilled in the art will appreciate that the disclosed processes can be practiced with a processing system or a computer processor, either alone or in conjunction with a host computer (e.g., computer 1602 of FIG. 16, infra), which can include single-processor or multiprocessor computer systems, mini-computing devices, mainframe computers, as well as personal computers, hand-held computing devices (e.g., PDA, smart phone, watch), microprocessor-based or programmable consumer or industrial electronics, and the like. The illustrated aspects may also be practiced in distributed computing environments where tasks are performed by remote processing devices that are linked through a communications network. However, some, if not all aspects of the subject innovation can be practiced on stand-alone electronic devices, such as a memory card, Flash memory module, removable memory, or the like. In a distributed computing environment, program modules can be located in both local and remote memory storage modules or devices.

FIG. 15 illustrates a block diagram of an example operating and control environment 1500 for a memory bank 1502 of a multi-bank memory cell array according to aspects of the subject disclosure. In at least one aspect of the subject disclosure, memory bank 1502 can comprise memory selected from a variety of memory cell technologies. In at least one embodiment, memory bank 1502 can comprise a two-terminal memory technology, arranged in a compact two or three dimensional architecture. Suitable two-terminal memory technologies can include resistive-switching memory, conductive-bridging memory, phase-change memory, organic memory, magneto-resistive memory, or the like, or a suitable combination of the foregoing. In an embodiment, memory bank 1502 can be configured to operate according to a first set of configurations (e.g., MLC, SLC, operation voltage, clock speed, latency, etc.) that is at least in part different from a second set of configurations of a second memory bank of the multi-bank array of memory.

A column controller 1506 and sense amps 1508 can be formed adjacent to memory bank 1502. Moreover, column controller 1506 can be configured to activate (or identify for activation) a subset of bitlines of memory bank 1502. Column controller 1506 can utilize a control signal provided by a reference and control signal generator(s) 1518 to activate, as well as operate upon, respective ones of the subset of bitlines, applying suitable program, erase or read voltages to those bitlines. Non-activated bitlines can be kept at an inhibit voltage (also applied by reference and control signal generator(s) 1518), to mitigate or avoid bit-disturb effects on these non-activated bitlines.

In addition, operating and control environment 1500 can comprise a row controller 1504. Row controller 1504 can be formed adjacent to and electrically connected with word lines of memory bank 1502. Further, utilizing control signals of reference and control signal generator(s) 1518, row controller 1504 can select particular rows of memory cells with a suitable selection voltage. Moreover, row controller 1504 can facilitate program, erase or read operations by applying suitable voltages at selected word lines.

Sense amps 1508 can read data from, or write data to the activated memory cells of memory bank 1502, which are selected by column control 1506 and row control 1504. Data read out from memory bank 1502 can be provided to an input and input/output buffer 1512 (e.g., an LPDDR buffer, in some embodiments). Likewise, data to be written to memory bank 1502 can be received from the input and input/output buffer 1512 and written to the activated memory cells of memory bank 1502.

A clock source(s) 1510 can provide respective clock pulses to facilitate timing for read, write, and program operations of row controller 1504 and column controller 1506. Clock source(s) 1510 can further facilitate selection of wordlines or bitlines in response to external or internal commands received by operating and control environment 1500. Input and input/output buffer 1512 can comprise a command and address input, as well as a bidirectional data input and output. Instructions are provided over the command and address input, and the data to be written to memory bank 1502 as well as data read from memory bank 1502 is conveyed on the bidirectional data input and output, facilitating connection to an external host apparatus, such as a computer or other processing device (not depicted, but see e.g., computer 1602 of FIG. 16, infra).

Input and input/output buffer 1512 can be configured to receive write data, receive an erase instruction, receive a status or maintenance instruction, output readout data, output status information, and receive address data and command data, as well as address data for respective instructions. Address data can be transferred to row controller 1504 and column controller 1506 by an address register 1510. In addition, input data is transmitted to memory bank 1502 via signal input lines between sense amps 1508 and input and input/output buffer 1512, and output data is received from memory bank 1502 via signal output lines from sense amps 1508 to input and input/output buffer 1512. Input data can be received from the host apparatus, and output data can be delivered to the host apparatus via the I/O bus.

Commands received from the host apparatus can be provided to a command interface 1516. Command interface 1516 can be configured to receive external control signals from the host apparatus, and determine whether data input to the input and input/output buffer 1512 is write data, a command, or an address. Input commands can be transferred to a state machine 1520.

State machine 1520 can be configured to manage programming and reprogramming of memory bank 1502 (as well as other memory banks of the multi-bank memory array). Instructions provided to state machine 1520 are implemented according to control logic configurations, enabling state machine 1520 to manage read, write, erase, data input, data output, and other functionality associated with memory bank 1502. In some aspects, state machine 1520 can send and receive acknowledgments and negative acknowledgments regarding successful receipt or execution of various commands. In further embodiments, state machine 1520 can decode and implement status-related commands, decode and implement configuration commands, and so on.

To implement read, write, erase, input, output, etc., functionality, state machine 1520 can control clock source(s) 1508 or reference and control signal generator(s) 1518. Control of clock source(s) 1508 can cause output pulses configured to facilitate row controller 1504 and column controller 1506 implementing the particular functionality. Output pulses can be transferred to selected bitlines by column controller 1506, for instance, or wordlines by row controller 1504, for instance.

In connection with FIG. 16, the systems and processes described below can be embodied within hardware, such as a single integrated circuit (IC) chip, multiple ICs, an application specific integrated circuit (ASIC), or the like. Further, the order in which some or all of the process blocks appear in each process should not be deemed limiting. Rather, it should be understood that some of the process blocks can be executed in a variety of orders, not all of which may be explicitly illustrated herein.

Figure 16:
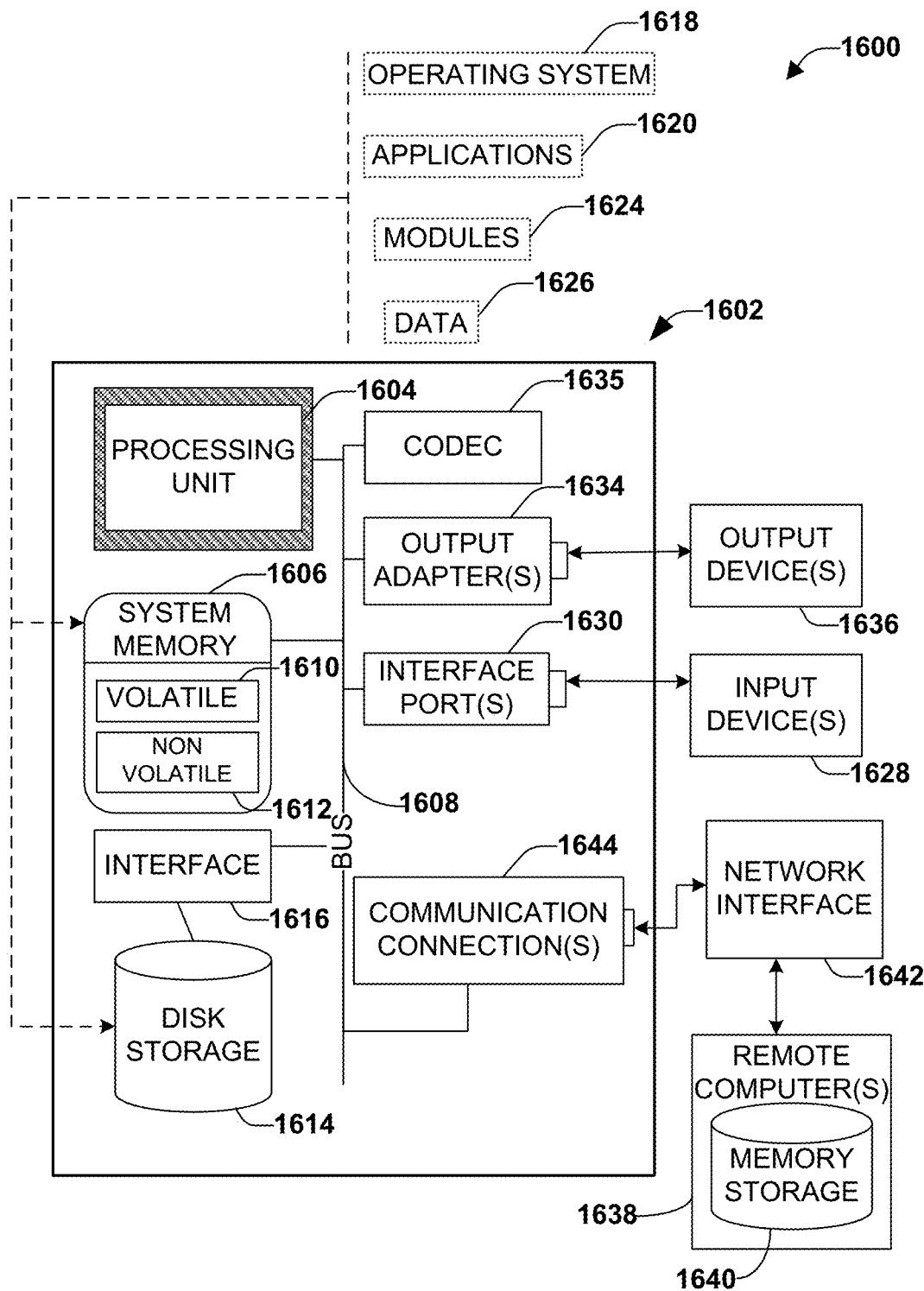
FIG. 16 illustrates a block diagram of an example computing environment that can be implemented in conjunction with various embodiments.

With reference to FIG. 16, a suitable operating environment 1600 for implementing various aspects of the claimed subject matter includes a computer 1602. The computer 1602 includes a processing unit 1604, a system memory 1606, a codec 1635, and a system bus 1608. The system bus 1608 couples system components including, but not limited to, the system memory 1606 to the processing unit 1604. The processing unit 1604 can be any of various available processors. Dual microprocessors and other multiprocessor architectures also can be employed as the processing unit 1604.

The system bus 1608 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

The system memory 1606 includes volatile memory 1610 and non-volatile memory 1614, which can employ one or more of the disclosed memory architectures, in various embodiments. The basic input/output system (BIOS), containing the basic routines to transfer information between elements within the computer 1602, such as during start-up, is stored in non-volatile memory 1612. In addition, according to present innovations, codec 1635 may include at least one of an encoder or decoder, wherein the at least one of an encoder or decoder may consist of hardware, software, or a combination of hardware and software. Although, codec 1635 is depicted as a separate component, codec 1635 may be contained within non-volatile memory 1612. By way of illustration, and not limitation, non-volatile memory 1612 can include read only memory (ROM), programmable ROM (PROM), electrically programmable ROM (EPROM), electrically erasable programmable ROM (EEPROM), or Flash memory. Non-volatile memory 1612 can employ one or more of the disclosed memory architectures comprising two-terminal resistive switching memory, in at least some disclosed embodiments. Moreover, non-volatile memory 1612 can be computer memory (e.g., physically integrated with computer 1602 or a mainboard thereof), or removable memory. Examples of suitable removable memory with which disclosed embodiments can be implemented can include a secure digital (SD) card, a compact Flash (CF) card, a universal serial bus (USB) memory stick, or the like. Volatile memory 1610 includes random access memory (RAM), which acts as external cache memory, and can also employ one or more disclosed memory architectures in various embodiments. By way of illustration and not limitation, RAM is available in many forms such as static RAM (SRAM), dynamic RAM (DRAM), synchronous DRAM (SDRAM), double data rate SDRAM (DDR SDRAM), and enhanced SDRAM (ESDRAM), and so forth.

Computer 1602 may also include removable/non-removable, volatile/non-volatile computer storage medium. FIG. 16 illustrates, for example, disk storage 1614. Disk storage 1614 includes, but is not limited to, devices such as a magnetic disk drive, solid state disk (SSD) floppy disk drive, tape drive, Jaz drive, Zip drive, LS-100 drive, flash memory card, or memory stick. In addition, disk storage 1614 can include storage medium separately or in combination with other storage medium including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage 1614 to the system bus 1608, a removable or non-removable interface is typically used, such as interface 1616. It is appreciated that disk storage 1614 can store information related to a user. Such information might be stored at or provided to a server or to an application running on a user device. In one embodiment, the user can be notified by way of output device(s) 1636) of the types of information that are stored to disk storage 1614 and/or transmitted to the server or application. The user can be provided the opportunity to opt-in or opt-out of having such information collected and/or shared with the server or application (e.g., by way of input from input device(s) 1628).

It is to be appreciated that FIG. 16 describes software that acts as an intermediary between users and the basic computer resources described in the suitable operating environment 1600. Such software includes an operating system 1618. Operating system 1618, which can be stored on disk storage 1614, acts to control and allocate resources of the computer 1602. Applications 1620 take advantage of the management of resources by operating system 1618 through program modules 1624, and program data 1626, such as the boot/shutdown transaction table and the like, stored either in system memory 1606 or on disk storage 1614. It is to be appreciated that the claimed subject matter can be implemented with various operating systems or combinations of operating systems.

A user enters commands or information into the computer 1602 through input device(s) 1628. Input devices 1628 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1604 through the system bus 1608 via interface port(s) 1630. Interface port(s) 1630 include, for example, a serial port, a parallel port, a game port, and a universal serial bus (USB). Output device(s) 1636 use some of the same type of ports as input device(s) 1628. Thus, for example, a USB port may be used to provide input to computer 1602 and to output information from computer 1602 to an output device 1636. Output adapter 1634 is provided to illustrate that there are some output devices, such as monitors, speakers, and printers, among other output devices, which require special adapters. The output adapter 1634 can include, by way of illustration and not limitation, video and sound cards that provide a means of connection between the output device 1636 and the system bus 1608. It should be noted that other devices and/or systems of devices provide both input and output capabilities such as remote computer(s) 1638.

Computer 1602 can operate in a networked environment using logical connections to one or more remote computers, such as remote computer(s) 1638. The remote computer(s) 1638 can be a personal computer, a server, a router, a network PC, a workstation, a microprocessor based appliance, a peer device, a smart phone, a tablet, or other network node, and typically includes many of the elements described relative to computer 1602. For purposes of brevity, only a memory storage device 1640 is illustrated with remote computer(s) 1638. Remote computer(s) 1638 is logically connected to computer 1602 through a network interface 1642 and then connected via communication connection(s) 1644. Network interface 1642 encompasses wire and/or wireless communication networks such as local-area networks (LAN) and wide-area networks (WAN) and cellular networks. LAN technologies include Fiber Distributed Data Interface (FDDI), Copper Distributed Data Interface (CDDI), Ethernet, Token Ring and the like. WAN technologies include, but are not limited to, point-to-point links, circuit switching networks such as Integrated Services Digital Networks (ISDN) and variations thereon, packet switching networks, and Digital Subscriber Lines (DSL).

Communication connection(s) 1644 refers to the hardware/software employed to connect the network interface 1642 to the system bus 1608. While communication connection 1644 is shown for illustrative clarity inside computer 1602, it can also be external to computer 1602. The hardware/software necessary for connection to the network interface 1642 includes, for exemplary purposes only, internal and external technologies such as, modems including regular telephone grade modems, cable modems and DSL modems, ISDN adapters, and wired and wireless Ethernet cards, hubs, and routers.

The illustrated aspects of the disclosure may also be practiced in distributed computing environments where certain tasks are performed by remote processing devices that are linked through a communications network. In a distributed computing environment, program modules or stored information, instructions, or the like can be located in local or remote memory storage devices.

Moreover, it is to be appreciated that various components described herein can include electrical circuit(s) that can include components and circuitry elements of suitable value in order to implement the embodiments of the subject disclosure. Furthermore, it can be appreciated that many of the various components can be implemented on one or more IC chips. For example, in one embodiment, a set of components can be implemented in a single IC chip. In other embodiments, one or more of respective components are fabricated or implemented on separate IC chips.

As utilized herein, terms "component," "system," "architecture" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the disclosed subject matter.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, replicating, mimicking, determining, or transmitting, and the like, refer to the action and processes of processing systems, and/or similar consumer or industrial electronic devices or machines, that manipulate or transform data or signals represented as physical (electrical or electronic) quantities within the circuits, registers or memories of the electronic device(s), into other data or signals similarly represented as physical quantities within the machine or computer system memories or registers or other such information storage, transmission and/or display devices.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

What is claimed is:

1. A method for operating a network router device, comprising:

receiving a data packet comprising a network address at an input interface of the network router device;

entering the network address onto a set of input signal lines of an address-matching array of the network router device;

generating one or more address-matched output signals on a set of output signal lines in response to the network address matching one or more bit pattern addresses stored at the set of output signal lines;

latching the one or more address-matched output signals and generating latched data representing the one or more address-matched output signals;

generating a single address-matched output signal from the latched data;

inputting the single address-matched output signal to a set of downstream port lines of the network router device in response to entering the network address;

receiving a second data packet comprising a second network address at the input interface of the network router device;

entering the second network address onto a second set of input signal lines of the network router device, the second set of input signal lines being connected to a second address-matching array of the network router device having the bit pattern addresses stored at second output signal lines connected to the second address-matching array; and generating one or more second address-matched output signals on the second output signal lines in response to the second network address matching one or more of the bit pattern addresses stored at the second output signal lines.

2. The method of claim 1, further comprising:
measuring output signals of the set of downstream port lines in response to inputting the single address-matched output signal to the set of downstream port lines;
identifying a downstream port line of the set of downstream port lines that is associated with the network address from measured output signals of the set of downstream port lines; and
transmitting the data packet on a downstream port associated with the downstream port line.

3. The method of claim 2, further comprising:
receiving a third data packet comprising a second network address at the input interface of the network router device, and
entering the third network address onto the set of input signal lines concurrent with or subsequent to the latching the one or more address-matched output signals.

4. The method of claim 3, further comprising
latching the single address-matched output signal prior to inputting the single address-matched output signal to the set of downstream port lines;
generating one or more additional address-matched output signals on the set of output signal lines in response to the third network address matching one or more of the bit pattern addresses stored at the respective output signal lines; and
latching the one or more additional address-matched output signals.

5. The method of claim 4, further comprising:
receiving a fourth data packet comprising a fourth network address at the input interface of the network router device; and
entering the fourth network address onto the set of input signal lines concurrent with or subsequent to the latching the single address-matched output signal or the latching the one or more additional address-matched output signals.

6. The method of claim 5, wherein generating the single address-matched output signal from latched data further comprises employing a priority encoding to select no more than one of the one or more address-matched output signals as the single address-matched output signal based on the priority encoding.

7. The method of claim 2, further comprising:
inputting the single address-matched output signal to a set of forward address lines of the network router device in response to entering the network address; and
measuring forward line output signals of the set of forward address lines in response to inputting the single address-matched output signal to the set of forward address lines and identifying a forwarding address that is associated with the network address from measured forward line output signals of the set of forward address lines.

8. The method of claim 7, wherein transmitting the data packet on the downstream port further comprises transmitting the data packet according to the identified forwarding address associated with the network address.

9. The method of claim 1, further comprising receiving an address program instruction in conjunction with a new bit pattern address and a new priority encoding for the bit pattern address and one or more bit pattern addresses stored at the output signal lines.

10. The method of claim 9; further comprising:
identifying a blank output line of the network router device available for storing bit patterns;
updating a priority encoding of the network router device with the new priority encoding; and at least one of:
writing the new bit pattern address to the identified blank output line; or
shifting a subset of the one or more bit pattern addresses among the output signal lines to encompass the blank output line, and writing the new bit pattern address to a newly available output signal line resulting from shifting the subset of the one or more bit pattern addresses to encompass the blank output line.

11. The method of claim 9, further comprising:
updating bit pattern address programming of an alternate address-matching array of the network router device to incorporate the new bit pattern address among the bit pattern addresses stored at third output signal lines of the alternate address-matching array;
shifting data packet processing to the alternate address-matching array of the network router device; and
updating bit pattern address programming of a primary address-matching array of the network router device comprising the output signal lines to incorporate the new bit pattern address among the bit pattern addresses stored at the output signal lines.

12. The method of claim 1, further comprising:
generating a second single address-matched output signal from the one or more second address-matched output signals; and
inputting the second single address-matched output signal to the set of downstream port lines of the network router device.

13. The method of claim 12, wherein generating the one or more second address-matched output signals at the second address-matching array is in part concurrent with the generating the one or more address-matched output signals.

14. A network router device, comprising:
an address-matching circuit comprising a plurality of input lines including an input line and a plurality of output lines including an output line, wherein each intersection of the plurality of input lines with the output line comprises a non-volatile memory circuit of a group of non-volatile memory circuits, and wherein the group of non-volatile memory circuits is reversibly programmable to store a pattern of bits that match a plurality of network addresses, and wherein intersections of the plurality of input lines with a second output line of the plurality of output lines comprises a second non-volatile memory circuit of the group of non-volatile memory circuits reversibly programmed to store a second pattern of bits, and wherein the output line is configured to provide a default voltage in response to input by the network router device of a network address of the plurality of network addresses on the plurality of input lines and the second output line is configured to provide a second default voltage in response to input by the network router device of the network address;
a pipeline circuit configured to latch multiple default voltage outputs including the default voltage on the output line and the second default voltage on the second output line in response to the input of the network address on the plurality of input lines and generate latched data representing the multiple default voltage outputs;
a priority encoder configured to receive the latched data from the pipeline circuit and select a single matched output among the multiple default voltage outputs from the latched data in response to input of the network address of the plurality of network addresses, wherein in response to a clock signal, the pipeline circuit is configured to provide the latched data to the priority encoder concurrent with a second network address received at the plurality of input lines; and a port-mapping circuit configured to identify a downstream port mapped to the single matched output;

wherein the network router device transmits a received data packet addressed to the network address on the downstream port in response to the port-mapping circuit identifying the downstream port.

15. The network router device of claim 14, further comprising a forward address-mapping circuit configured to:

store an association of forwarding addresses with at least a subset of the plurality of network addresses, determine whether a forwarding address of the forwarding addresses is associated with the single matched output; and output the forwarding address to facilitate transmission of the received data packet on the downstream port according to the forwarding address in response to determining the forwarding address is associated with the single matched output.

16. The network router device of claim 14, further comprising a second pipeline circuit configured to latch the single matched output identified by the priority encoder, and to provide the single matched output to the port-mapping circuit in response to a clock signal.

17. The network router device of claim 14, further comprising a second group of non-volatile memory circuits connected at respective intersections of the plurality of input lines and a second output line, wherein the second group of non-volatile memory circuits is unprogrammed and facilitates storage of a new pattern of bits associated with a new network address that is not among the plurality of network addresses.

18. The network router device of claim 14, further comprising a second address-matching circuit, wherein the second address-matching circuit at least one of the following:

stores a duplicate of the pattern of bits at a second output line of a second plurality of output lines, wherein the second address-matching circuit is updated to store an updated pattern of bits and an updated priority encoding concurrent with processing of the one of the plurality of network addresses by the address-matching circuit; or stores a second pattern of bits at the second output line of the second plurality of output lines, wherein the network router device inputs the network address concurrently at the address-matching circuit and the second address-matching circuit, and wherein the priority encoder is further configured to select the single matched output among a first of the multiple default voltage outputs provided by the address-matching circuit and a second of the multiple default voltage outputs provided by the second address-matching circuit.

19. The network router device of claim 14, further comprising a second address-matching circuit that stores a duplicate of the pattern of bits, and an address distributor that routes the network address to the address-matching circuit and routes a second network address of the plurality of network addresses to the second address-matching circuit, wherein the address-matching circuit processes the network address in part concurrent with the second address-matching circuit processing the second network address.

20. A method for operating a network router device, comprising:

receiving a data packet comprising a network address at an input interface of the network router device;

entering the network address onto a set of input signal lines of the network router device;

generating an address-matched output signal on a set of output signal lines in response to the network address matching one or more bit pattern addresses stored at respective non-volatile memory circuits coupled to the set of output signal lines;

in response to a clock signal, latching a plurality of output signals generated by the set of output signal lines including the address-matched output signal concurrent with receiving a second network address on the set of input signal lines of a second data packet received at the input interface of the network router device, and generating latched data representing the plurality of output signals including the address-matched output signal; and inputting the latched data to a set of downstream port lines of the network router device in response to entering the network address.

21. The method of claim 20, further comprising:

receiving a third data packet comprising a third network address at the input interface of the network router device;

entering the third network address onto a second set of input signal lines of the network router device, the second set of input signal lines being part of a second address-matching array of the network router device having the bit pattern addresses stored at respective second non-volatile memory circuits coupled to second output signal lines of the second address-matching array; and generating one or more second address-matched output signals on the second output signal lines in response to the third network address matching one or more of the bit pattern addresses stored at the second output signal lines.

22. A network router device, comprising:

an address-matching circuit comprising a plurality of input lines including an input line and a plurality of output lines including an output line, wherein each intersection of the plurality of input lines with the output line comprises respective non-volatile memory circuits of a group of non-volatile memory circuits, and wherein the group of non-volatile memory circuits is reversibly programmable to store a pattern of bits that match a network address of a plurality of network addresses, and wherein the output line is configured to provide a default voltage in response to input by the network router device of the network address on the plurality of input lines;

a second address-matching circuit comprising a second plurality of input lines including a second input line and a second plurality of output lines including a second output line, wherein each intersection of the second plurality of input lines with the second output line comprises respective non-volatile memory circuits of a second group of non-volatile memory circuits, and wherein the second group of non-volatile memory circuits is reversibly programmable to store a second pattern of bits, different from the pattern of bits, that partly matches the network address of the plurality of network addresses, and wherein the second output line is configured to provide a second default voltage in response to input by the network router device of the network address on the second plurality of input lines;

a priority encoder configured to receive the default voltage on the output line and the second default voltage on the second output line and select a single matched output among the output line and the second output line in response to input of the network address; and a port-mapping circuit configured to identify a downstream port mapped to the single matched output;

wherein the network router device transmits a received data packet addressed to the network address on the downstream port in response to the port-mapping circuit identifying the downstream port.

23. The network router device of claim 22, further comprising a pipeline circuit configured to latch the default voltage of the output line and the second default voltage of the second output line and generate latched data representing output signals of the plurality of output lines and the second plurality of output lines, wherein in response to a clock signal, the pipeline circuit is configured to provide the latched data to the priority encoder concurrent with a second network address received at the plurality of input lines and at the second plurality of input lines.

* * * * *